US009625828B2

(12) United States Patent
Riepen et al.

(10) Patent No.: US 9,625,828 B2
(45) Date of Patent: Apr. 18, 2017

(54) FLUID HANDLING STRUCTURE, LITHOGRAPHIC APPARATUS AND DEVICE MANUFACTURING METHOD

(75) Inventors: Michel Riepen, Veldhoven (NL); Erik Henricus Egidius Catharina Eummelen, Eindhoven (NL); Sandra Van Der Graaf, 's-Hertogenbosch (NL); Rogier Hendrikus Magdalena Cortie, Ittervoort (NL); Takeshi Kaneko, 's-Hertogenbosch (NL); Nina Vladimirovna Dziomkina, Eindhoven (NL); Laurentius Johannes Adrianus Van Bokhoven, Veldhoven (NL); Fabrizio Evangelista, Eindhoven (NL); David Bessems, Eindhoven (NL); Cornelius Maria Rops, Waalre (NL); Adrianus Marinus Verdonck, Wouwse Plantage (NL); Nicolaas Ten Kate, Almkerk (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1838 days.

(21) Appl. No.: 13/022,319

(22) Filed: Feb. 7, 2011

(65) Prior Publication Data
US 2011/0194084 A1    Aug. 11, 2011

Related U.S. Application Data

(60) Provisional application No. 61/302,684, filed on Feb. 9, 2010, provisional application No. 61/366,116, filed on Jul. 20, 2010.

(51) Int. Cl.
*G03F 7/20* (2006.01)

(52) U.S. Cl.
CPC .................... *G03F 7/70341* (2013.01)

(58) Field of Classification Search
CPC .................................................... G03F 7/70341
See application file for complete search history.

(56) References Cited

U.S. PATENT DOCUMENTS

| 4,509,852 A | 4/1985 | Tabarelli et al. |
| 8,279,396 B2 | 10/2012 | Ten Kate et al. |

(Continued)

FOREIGN PATENT DOCUMENTS

| CN | 201233505 | 5/2009 |
| EP | 1420298 | 5/2004 |

(Continued)

OTHER PUBLICATIONS

Japanese Office Action mailed Aug. 28, 2012 in corresponding Japanese Patent Application No. 2011-025713.

(Continued)

*Primary Examiner* — Chia-How Michael Liu
(74) *Attorney, Agent, or Firm* — Pillsbury Winthrop Shaw Pittman LLP

(57) ABSTRACT

A fluid handling structure for a lithographic apparatus, the fluid handling structure successively having, at a boundary from a space configured to comprise immersion fluid to a region external to the fluid handling structure: an extractor having at least one opening arranged in a first line that, in use, is directed towards a substrate and/or a table; and a liquid manipulator on a surface that, in use, faces the substrate and/or table to reduce the chance of droplets on the surface from coalescing.

20 Claims, 14 Drawing Sheets

(56) References Cited

U.S. PATENT DOCUMENTS

| | | |
|---|---|---|
| 2004/0136494 A1 | 7/2004 | Lof et al. |
| 2004/0207824 A1 | 10/2004 | Lof et al. |
| 2005/0175776 A1 | 8/2005 | Streefkerk et al. |
| 2006/0038968 A1 | 2/2006 | Kemper et al. |
| 2006/0119809 A1 | 6/2006 | Verhagen et al. |
| 2007/0030464 A1 | 2/2007 | Kemper et al. |
| 2007/0122561 A1 | 5/2007 | Sewell |
| 2008/0002169 A1 | 1/2008 | Hasegawa et al. |
| 2008/0212046 A1 | 9/2008 | Riepen et al. |
| 2008/0233512 A1 | 9/2008 | Nishii et al. |
| 2009/0168032 A1 | 7/2009 | Ten Kate et al. |
| 2009/0206304 A1 | 8/2009 | Dziomkina |
| 2009/0231560 A1 | 9/2009 | Poon et al. |
| 2010/0103391 A1 | 4/2010 | Van Den Dungen et al. |
| 2010/0313974 A1 | 12/2010 | Riepen et al. |
| 2011/0013159 A1 | 1/2011 | Kramer et al. |

FOREIGN PATENT DOCUMENTS

| | | |
|---|---|---|
| EP | 1420300 | 5/2004 |
| JP | 2006-346583 | 12/2006 |
| JP | 2007-142366 | 6/2007 |
| JP | 2008-235620 | 10/2008 |
| JP | 2009-141357 | 6/2009 |
| WO | 99/49504 | 9/1999 |
| WO | 2005/064405 | 7/2005 |

OTHER PUBLICATIONS

A. Satyaprasad, V Jain and S K Nema, "Deposition of superhydrophobic hanostructured Teflon-like coating using expanding plasma arc," Applied Surface Science 253 (2007) pp. 5462-5466.

Xue-Mei Li, David Reinhoudt and Mercedes Crego-Calama, "What do we need for a superhydrophobic surface? A review on the recent progress in the preparation of superhydrophobic surfaces," Chemical Society Reviews 2007, 36, pp. 1350-1368.

Paul Roach, Neil Shirtcliffe and Michael Newton, "Progress in superhydrophobic surface development," Soft Matter, 2008, 4, pp. 224-240.

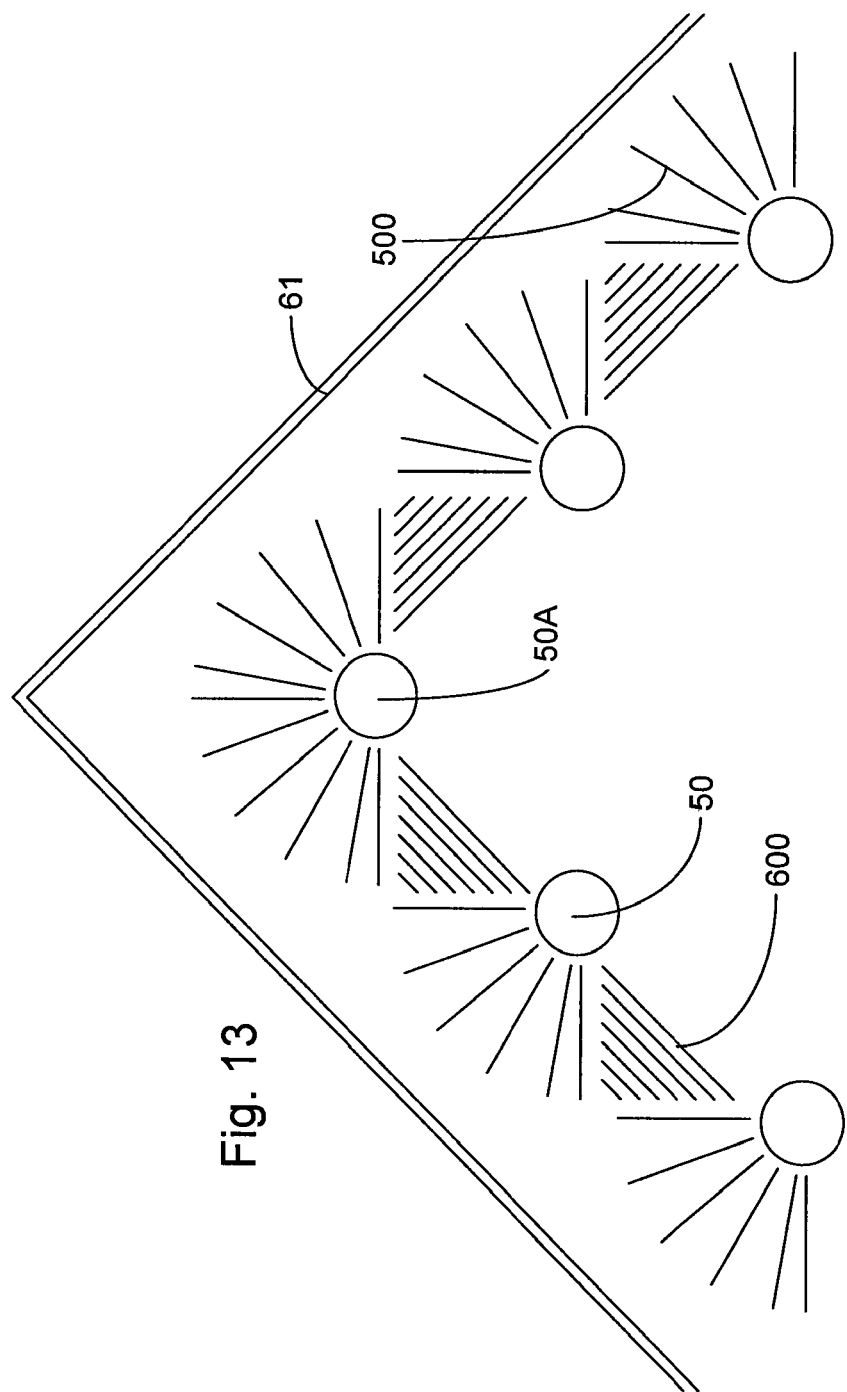

$$\cos \theta = 1 - \frac{x}{L}$$

FLUID HANDLING STRUCTURE, LITHOGRAPHIC APPARATUS AND DEVICE MANUFACTURING METHOD

This application claims priority and benefit under 35 U.S.C. §119(e) to U.S. Provisional Patent Application Ser. No. 61/302,684, entitled "Fluid Handling Structure, Lithographic Apparatus and Device Manufacturing Method", filed on Feb. 9, 2010, and to U.S. Provisional Patent Application Ser. No. 61/366,116, entitled "Fluid Handling Structure, Lithographic Apparatus and Device Manufacturing Method", filed on Jul. 20, 2010. The contents of those applications are incorporated herein in their entirety by reference.

FIELD

The present invention relates to a fluid handling structure, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, for example ultra-purified water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) is a form of immersion system arrangement. The arrangement requires that a large body of liquid should be accelerated during a scanning exposure. This may require additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. This type of arrangement may be referred to as a localized immersion system arrangement.

Another arrangement is an all wet arrangement in which the immersion liquid is unconfined as disclosed in PCT patent application publication WO 2005/064405. In such a system, the immersion liquid is unconfined. The whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. In an arrangement, the apparatus has two tables, one of which is configured to support a substrate and may be referred to as a substrate table. The other table may be referred to as a measurement table and may support a sensor (for example, to sense a property of the projection system) and/or a cleaning component. In another arrangement, the apparatus has only one table.

SUMMARY

It is desirable to reduce the chance of bubble inclusion in immersion liquid through which the substrate is imaged. It is desirable to minimize or even prevent inclusion of bubbles into immersion fluid through which the substrate is imaged.

According to an aspect, there is provided a fluid handling structure for a lithographic apparatus, the fluid handling structure successively having, at a boundary from a space configured to contain immersion fluid to a region external to the fluid handling structure: an extractor comprising at least one opening arranged in a first line that, in use, is directed towards a substrate and/or a table; and a liquid manipulator on a surface that, in use, faces the substrate and/or table to reduce the chance of droplets on the surface from coalescing.

According to an aspect, there is provided a fluid handling structure for a lithographic apparatus, the fluid handling structure successively having, at a boundary from a space configured to contain immersion fluid to a region external to the fluid handling structure: an extractor comprising at least one opening that, in use, is directed towards a substrate and/or a table; and a plurality of grooves in a surface of the fluid handling structure that, in use, faces the substrate and/or the table.

According to an aspect, there is provided a fluid handling structure for a lithographic apparatus, the fluid handling structure comprising: an elongate extractor comprising at least one opening that, in use, faces a facing surface, the facing surface comprising a substrate and/or a table; and a plurality of grooves in a surface of the fluid handling structure that, in use, faces the facing surface, wherein the grooves are substantially co-aligned and are angled relative to the extractor.

According to an aspect, there is provided a fluid handling structure for a lithographic apparatus, the fluid handling structure comprising: at least one gas knife opening configured to form in use a gas knife directed towards a facing surface, the facing surface comprising a substrate and/or a table; and a plurality of grooves in a surface of the fluid handling structure that, in use, faces the facing surface, wherein the grooves are substantially co-aligned and are angled relative to the gas knife opening.

According to an aspect, there is provided a fluid handling structure for a lithographic apparatus, the fluid handling structure comprising: an extractor comprising a porous member that, in use, faces a facing surface, the facing surface comprising a substrate and/or a table, wherein a surface of the porous member facing the facing surface has at least one recess and/or protrusion.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 13 depicts, in plan, an embodiment of the present invention;

DETAILED DESCRIPTION

Figure 1:
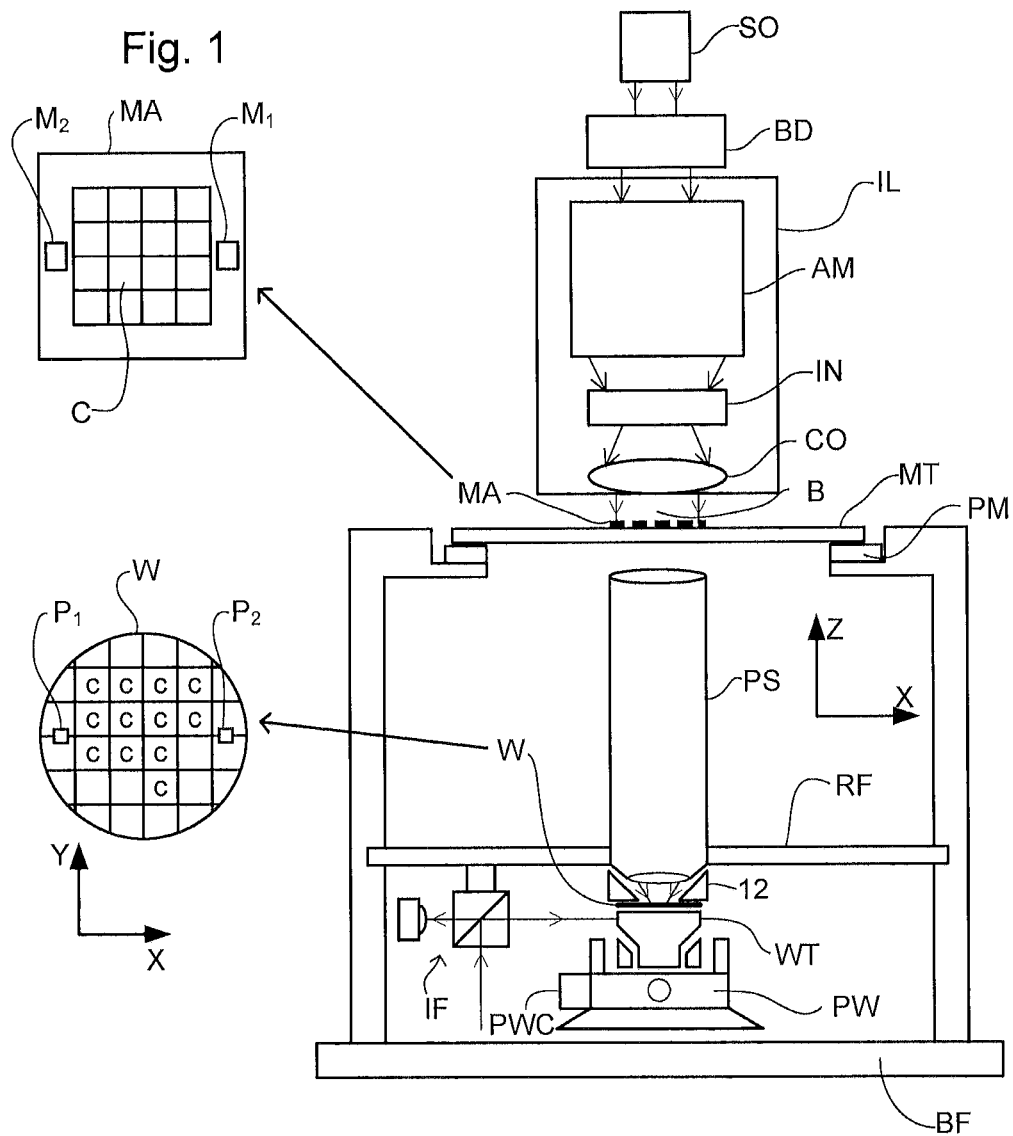
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into three general categories. These are the bath type arrangement, the so-called localized immersion system and the all-wet immersion system. In the bath type arrangement substantially the whole of the substrate W and optionally part of the substrate table WT is submersed in a bath of liquid.

The localized immersion system uses a liquid supply system in which liquid is only provided to a localized area of the substrate. The space filled by liquid is smaller in plan than the top surface of the substrate. The volume or space filled with liquid remains substantially stationary relative to the projection system PS while the substrate W moves underneath that area. FIGS. 2-5 show different supply devices which can be used in such a system.

In the all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 (which are described below) may be used in such a system. However, sealing features might not be present, might not be activated, might not be as efficient as normal or might otherwise be ineffective to seal liquid to only the localized area.

Figure 2:
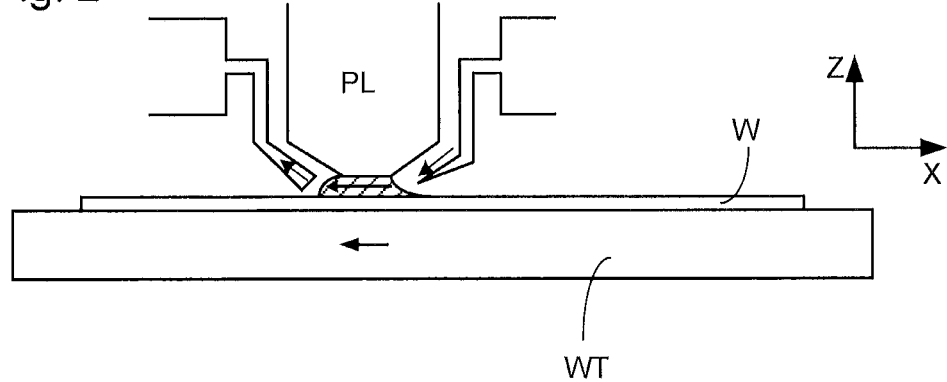
FIGS. 2 and 3 depict a liquid supply system for use in a lithographic projection apparatus.
Figure 3:
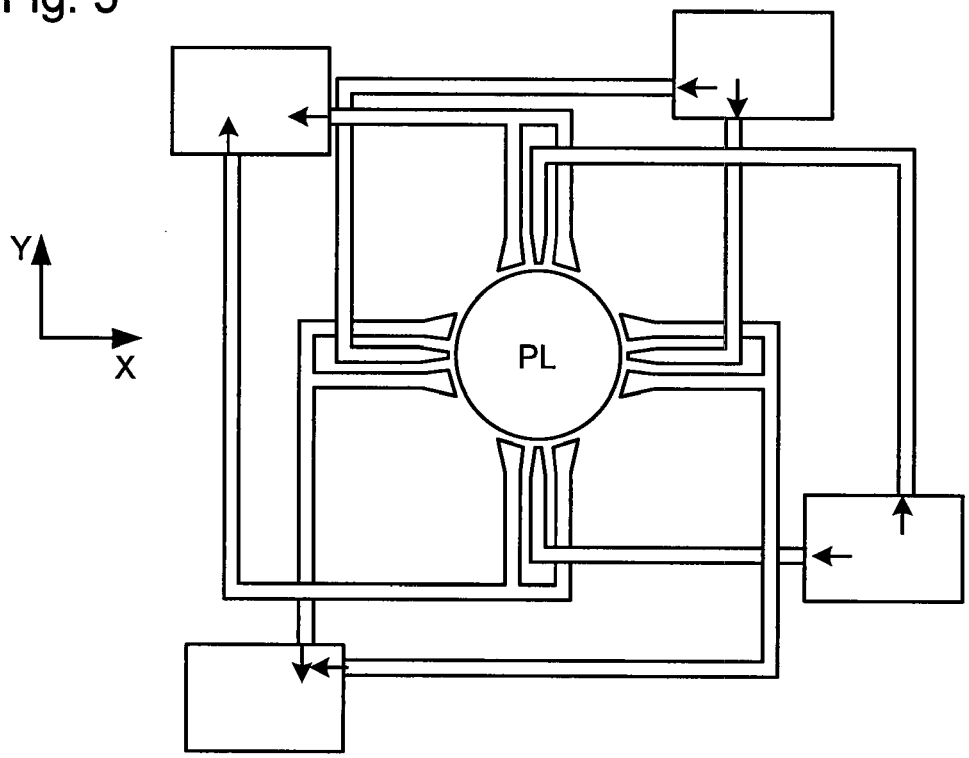

Four different types of localized liquid supply systems are illustrated in FIGS. 2-5. As illustrated in FIGS. 2 and 3, liquid is supplied by at least one inlet onto the substrate as indicated by an arrow, preferably along the direction of movement of the substrate relative to the final element. Liquid is removed by at least one outlet after having passed under the projection system as indicated by an arrow. As the substrate is scanned beneath the element in a −X direction, liquid is supplied at the +X side of the element and taken up at the −X side. FIG. 2 shows the arrangement schematically in which liquid flow is indicated by arrows; the liquid is supplied via inlet and is taken up on the other side of the element by outlet which is connected to a low pressure source. In the illustration of FIG. 2 the liquid is supplied along the direction of movement of the substrate relative to the final element, although this does not need to be the case. Various orientations and numbers of in- and out-lets positioned around the final element are possible; one example is illustrated in FIG. 3 in which four sets of an inlet with an outlet on either side are provided in a regular pattern around the final element, as indicated by arrows.

Figure 4:
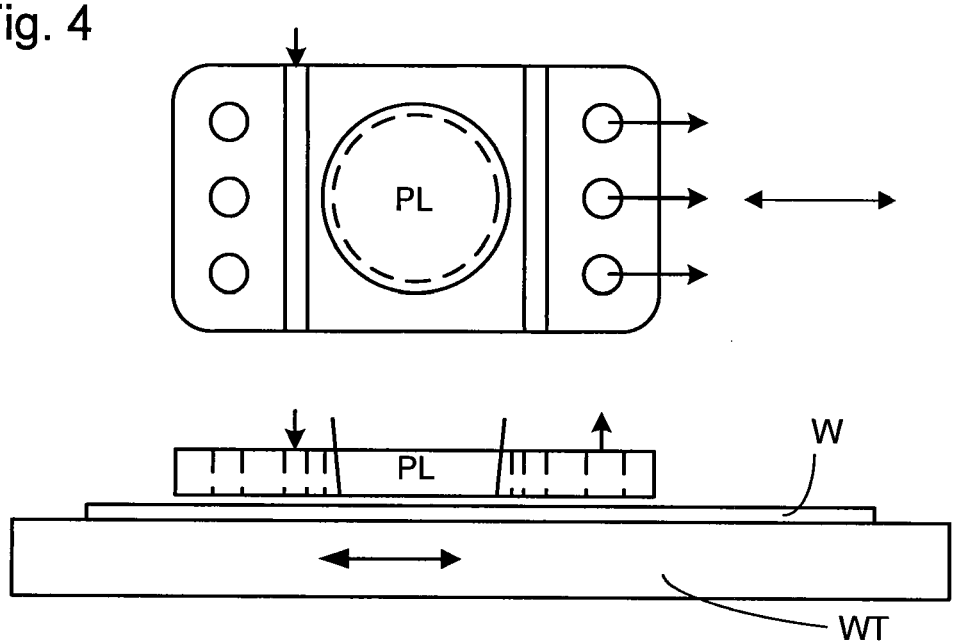
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate W is shown by arrows in FIG. 4.

Figure 5:
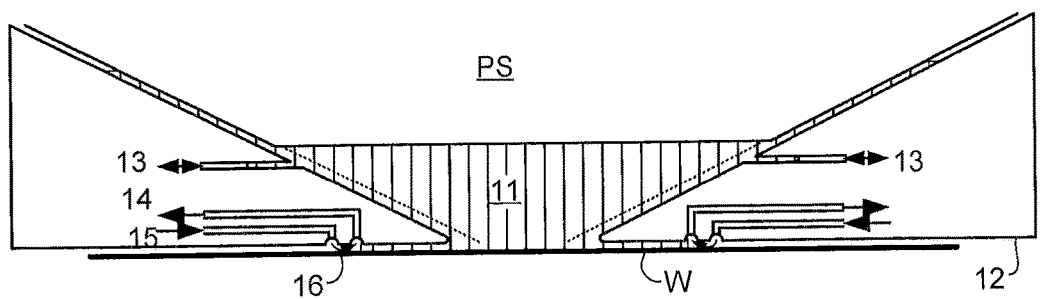
FIG. 5 depicts a further liquid supply system for use in a lithographic projection apparatus.

Another arrangement which has been proposed is to provide the liquid supply system with liquid confinement structure which extends along at least a part of a boundary of the space between the final element of the projection system and the substrate table. Such an arrangement is illustrated in FIG. 5. Arrows indicate the direction of flow.

FIG. 5 schematically depicts a localized liquid supply system or fluid handling structure with a liquid confinement structure 12, which extends along at least a part of a boundary of the space 11 between the final element of the projection system PS and a facing surface (e.g. the substrate table WT or substrate W). (Please note that reference in the following text to surface of the substrate W also refers in addition, or in the alternative, to a surface of the substrate table WT, unless expressly stated otherwise. Reference to movement of the substrate relative to another object, for example a projection system, includes reference to movement of the substrate table relative to the same object, unless expressly stated otherwise.) The liquid confinement structure 12 is substantially stationary relative to the projection system PS in the XY plane though there may be some relative movement in the Z direction (in the direction of the optical axis). In an embodiment, a seal is formed between the liquid confinement structure 12 and the surface of the substrate W. The seal may be a contactless seal such as a gas seal (such a system with a gas seal is disclosed in United States patent application publication no. US 2004-0207824) or fluid seal.

The liquid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the liquid confinement structure 12 positioned below and surrounding the final element of the projection system PS. Liquid is brought into the space 11 below the projection system PS and within the liquid confinement structure 12 by liquid inlet 13. The liquid may be removed by liquid outlet 13. The liquid confinement structure 12 may extend a little above the final element of the projection system PS. The liquid level rises above the final element so that a buffer of liquid is provided. In an embodiment, the liquid confinement structure 12 has an inner periphery that at the upper end closely conforms to the shape of the projection system PS or the final element thereof and may, e.g., be round or any other suitable shape. At the bottom, the inner periphery closely conforms to the shape of the image field, e.g., rectangular, though this need not be the case.

The liquid may be contained in the space 11 by a gas seal 16 which, during use, is formed between the bottom of the liquid confinement structure 12 and the surface of the substrate W. The gas seal 16 is formed by gas, e.g. air or synthetic air but, in an embodiment, N$_2$ or another inert gas. The gas in the gas seal 16 is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824, which is hereby incorporated by reference in its entirety. In another embodiment, the liquid confinement structure 12 does not have a gas seal.

An embodiment of the invention relates to a particular type of extractor for use in a fluid handling structure which substantially prevents the meniscus from advancing beyond a certain point. That is, an embodiment of the invention relates to a meniscus pinning device which pins the edge of liquid, e.g. in the form of a liquid meniscus, in a space 11 between the final element of the projection system and the substrate and/or substrate table substantially in place. The meniscus pinning arrangement relies on the so-called gas drag extractor principle which has been described, for example, in U.S. patent application publication no. 2008/0212046, which is hereby incorporated by reference in its entirety. In that system the extraction holes may be placed in a cornered shape. The corners are aligned with a direction of relative motion between the projection system and the substrate and/or substrate table, for example the stepping and scanning directions. This helps reduce the force on the meniscus between two outlets for a given speed in the direction of relative motion compared to a case where the two outlets are aligned perpendicular to the direction of relative motion. However, an embodiment of the invention may be applied to a fluid handling structure which, in plan, may have any shape, or to a fluid handling structure that has a component part such as the extraction openings arranged in any shape. Such a shape in a non-limiting list may include an ellipse (such as a circle), a rectilinear shape (such as a rectangle, e.g. a square, or parallelogram, e.g., a rhombus) or a cornered shape with more than four corners (such as a four or more pointed star).

In a variation of the system of US 2008/0212046, to which an embodiment of the invention relates, the geometry of the cornered shape in which the openings are arranged allows sharp corners (selected from the range of about 60° to 90°, desirably the range of 75° to 90° and most desirably the range of 75° to 85°) to be present for the corners aligned both in the preferred directions of relative motion, for example, in the scanning and in the stepping directions. This may allow increased speed in the direction of each aligned corner. This is because the creation of liquid droplets due to an unstable meniscus in the scanning direction is reduced. Where corners are aligned with both the scanning and stepping directions, increased speed may be achieved in those directions. Desirably the speed of movement in the scanning and stepping directions may be substantially equal.

Figure 6:
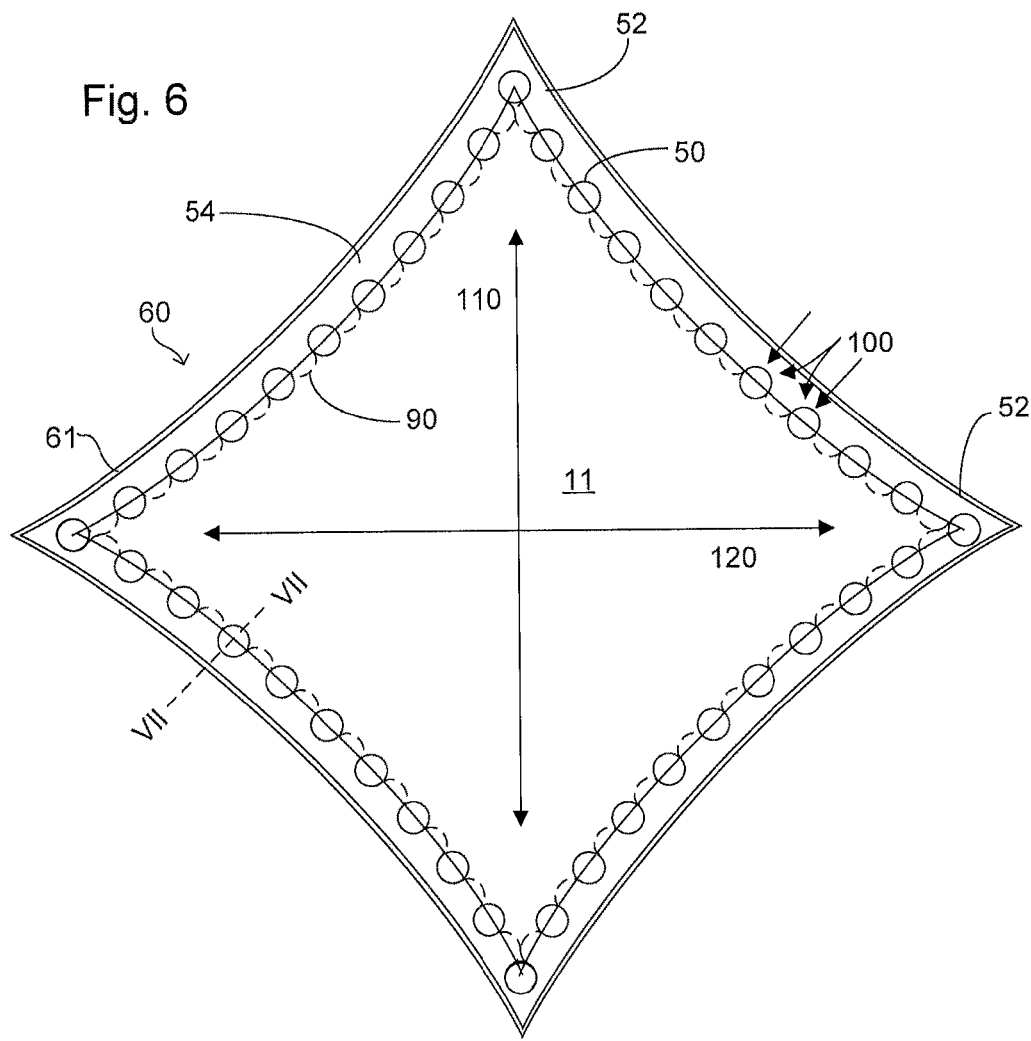
FIG. 6 is a schematic illustration, in plan, of a meniscus pinning system according to an embodiment of the present invention.

FIG. 6 illustrates schematically and in plan the meniscus pinning features of part of a fluid handling structure for use in an embodiment of the invention. The features of a meniscus pinning device are illustrated which may, for example, replace the Meniscus pinning arrangement 14, 15, 16 of FIG. 5: The meniscus pinning device of FIG. 6 comprises a plurality of discrete openings 50 arranged in a first line or pinning line. Each of these openings 50 are illustrated as being circular though this is not necessarily the case. Indeed one or more of the openings 50 may be one or more selected from a circle, square, rectangular, oblong, triangular, an elongate slit, etc. Each opening has, in plan, a length dimension (i.e. in the direction from one opening to the adjacent opening) of greater than 0.2 mm, desirably greater than 0.5 mm or 1 mm, in an embodiment selected from the range of 0.1 mm to 10 mm, in an embodiment selected from the range of 0.25 mm to 2 mm. In an embodiment the length dimension is selected from the range of 0.2 mm to 0.5 mm, desirably the range of 0.2 mm to 0.3 mm. In an embodiment, the width of each opening is selected from the range of 0.1 mm to 2 mm. In an embodiment, the width of each opening is selected from the range of 0.2 mm to 1 mm. In an embodiment, the width of each opening is selected from the range of 0.35 mm to 0.75 mm, desirably approximately 0.5 mm.

Each of the openings 50 of the meniscus pinning device of FIG. 6 may be connected to a separate under pressure source. Alternatively or additionally, each or a plurality of the openings 50 may be connected to a common chamber or manifold (which may be annular) which is itself held at an under pressure. In this way a uniform under pressure at each or a plurality of the openings 50 may be achieved. The openings 50 can be connected to a vacuum source and/or the atmosphere surrounding the fluid handling structure or system (or confinement structure, barrier member or liquid supply system) may be increased in pressure to generate the desired pressure difference.

In the embodiment of FIG. 6 the openings are fluid extraction openings. The openings 50 are inlets for the passage of gas and/or liquid into the fluid handling structure.

That is, the openings may be considered as outlets from the space 11. This will be described in more detail below.

The openings 50 are formed in a surface of a fluid handling structure 12. That surface faces the substrate and/or substrate table, in use. In one embodiment the openings are in a flat surface of the fluid handling structure. In another embodiment, a ridge may be present on the surface of the fluid handling structure facing the substrate. In that embodiment the openings may be in the ridge. In an embodiment, the openings 50 may be defined by needles or tubes. The bodies of some of the needles, e.g., adjacent needles, may be joined together. The needles may be joined together to form a single body. The single body may form the shape which may be cornered.

Figure 7:
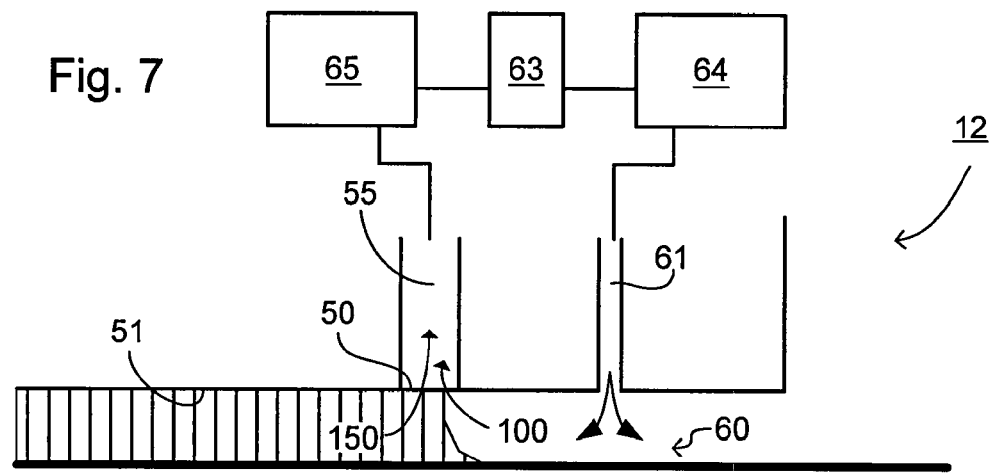
FIG. 7 depicts, in cross-section in part along line VII-VII in FIG. 6 and in a plane substantially perpendicular to a surface under a fluid handling structure, a meniscus pinning system for use in an embodiment of the present invention.

As can be seen from FIG. 7, the openings 50 are the end of a tube or elongate passageway 55, for example. Desirably the openings are positioned such that they face the substrate W in use. The rims (i.e. outlets out of a surface) of the openings 50 are substantially parallel to a top surface of the substrate W. The openings are directed, in use, towards the substrate W and/or substrate table WT configured to support the substrate. Another way of thinking of this is that an elongate axis of the passageway 55 to which the opening 50 is connected is substantially perpendicularly (within +/−45°, desirably within 35°, 25° or even 15° from perpendicular) to the top surface of the substrate W.

Each opening 50 is designed to extract a mixture of liquid and gas. The liquid is extracted from the space 11 whereas the gas is extracted from the atmosphere on the other side of the openings 50 to the liquid. This creates a gas flow as illustrated by arrows 100 and this gas flow is effective to pin the meniscus 90 between the openings 50 substantially in place as illustrated in FIG. 6. The gas flow helps maintain the liquid confined by momentum blocking, by a gas flow induced pressure gradient and/or by drag (shear) of the gas flow on the liquid.

The openings 50 surround the space to which the fluid handling structure supplies liquid. That is, the openings 50 may be distributed around the surface of the fluid handling structure facing the substrate and/or substrate table. The openings may be substantially continuously spaced around the space (In an embodiment the spacing between some of the adjacent openings may be the same, although the spacing between adjacent openings 50 may vary). In an embodiment, liquid is extracted all the way around the shape which may be cornered. Liquid is extracted substantially at the point at which it impinges on the shape. This is achieved because the openings 50 are formed all the way around the space (in the shape). In this way the liquid may be confined to the space 11. The meniscus may be pinned by the openings 50, during operation.

As can be seen from FIG. 6, the openings 50 may be positioned so as to form, in plan, a cornered shape (i.e. a shape with corners 52). In the case of FIG. 6 the shape is a quadrilateral, such as a rhombus, e.g. a square, with curved edges or sides 54. The edges 54 may have a negative radius. An edge 54 may curve towards the center of the cornered shape, for example along a portion of the edge 54 located away from the corners 52. However, the average of the angle of all points on the edge 54 relative to a direction of relative motion may be referred to as a line of average angle which may be represented by a straight line without curvature.

Principal axes 110, 120 of the shape may be aligned with the major directions of travel of the substrate W under the projection system. This helps to ensure that the maximum scan speed is faster than if the openings 50 were arranged in a shape in which the direction of movement is unaligned with an axis of the shape, for example a circular shape. This is because the force on the meniscus between two openings 50 may be reduced if the principle axes are aligned with a direction of relative motion. For example, the reduction may be a factor cos θ. 'θ' is the angle of the line connecting the two openings 50 relative to the direction in which the substrate W is moving.

The use of a square shape allows movement in the step and scanning directions to be at a substantially equal maximum speed. This may be achieved by having each of the corners 52 of the shape aligned with the scanning and stepping directions 110, 120. If movement in one of the directions, for example the scan direction, is preferred to be faster than movement in the other direction, for example the step direction, then the shape may be a rhombus. In such an arrangement the primary axis of the rhombus may be aligned with the scan direction. For a rhombic shape, although each of the corners may be acute, the angle between the line of average angle of two adjacent sides (or edges) of the rhombus, for example relative to a direction of relative motion in the stepping direction, may be obtuse, i.e. more than 90° (for example selected from the range of about 90° to 120°, in an embodiment selected from the range of 90° and 105', in an embodiment selected from the range of 85° and 105°).

Throughput can be optimized by making the primary axis of the shape of the openings 50 aligned with the major direction of travel of the substrate (usually the scan direction) and to have another axis aligned with the other major direction of travel of the substrate (usually the step direction). It will be appreciated that any arrangement in which 0 is different to 90° will give an advantage in at least one direction of movement. Thus, exact alignment of the principal axes with the major directions of travel is not vital.

An advantage of providing the edges with a negative radius is that the corners may be made sharper. An angle selected from the range of 75 to 85° or even lower may be achievable for both the corners 52 aligned with the scan direction and the corners 52 aligned with the step direction. If it were not for this feature then in order for the corners 52 aligned in both directions to have the same angle, those corners would have to have 90°. If it was desired that a corner would have an angle of less than 90°, it would be necessary to select corners aligned with a direction of relative motion to be less than 90°. The other corners would have an angle of greater than 90°.

The openings may be arranged in a star shape. In an embodiment of a star shape, the edges are straight instead of curved. The edges may meet at a point, e.g. an intermediate corner, which is radially inwardly of a straight line between two corners 52. This arrangement may not be as successful in pinning a meniscus at a high relative speed as an arrangement in which the edge between two adjacent corners 52 defined by the line joining the openings is smooth. Such a line defined by the openings 50 may define the cornered shape, is continuous and has a continuously changing direction. In the star shape embodiment, the intermediate corner along the side of the shape may pin the meniscus. The sharper a corner, the more the forces pinning the meniscus are focused on the corner. At a sharp corner, the pinning forces are focused on a short length of the edge of the shape. A corner with a smoother curve than a sharp corner, for example, a corner with a larger radius of curvature, has a longer length and so distributes the pinning forces along a longer curve of the corner i.e. around the corner. Thus, for a certain relative velocity between the substrate and the fluid handling structure, the effective meniscus pinning force applied to both corners is the same; However, for a defined length of the edge, the effective pinning force for the sharp corner is more than for the smoothly curved corner. The meniscus pinned at a sharp corner is more unstable at a lower relative velocity between the substrate and the fluid handling structure than a meniscus pinned by the smoothly curved corner.

FIG. 7 illustrates that the opening 50 is provided in a lower surface 51 of the fluid handling structure. This is however not necessarily the case and the opening 50 may be in a protrusion from the lower surface of the fluid handling structure. Arrow 100 shows the flow of gas from outside of the fluid handling structure into a passageway 55 associated with the opening 50. Arrow 150 illustrates the passage of liquid from the space into the opening 50. The passageway 55 and opening 50 are desirably designed so that two phase extraction (i.e. gas and liquid) desirably occurs in an annular flow mode. In annular gas flow gas may substantially flow through the center of the passageway 55 and liquid may substantially flow along the wall(s) of the passageway 55. A smooth flow with a desirably low generation of pulsations results.

There may be no meniscus pinning features radially inwardly of the openings 50. The meniscus is pinned between the openings 50 with drag forces induced by gas flow into the openings 50. A gas drag velocity of greater than about 15 m/s, desirably 20 m/s is sufficient. The amount of evaporation of liquid from the substrate may be reduced thereby reducing both splashing of liquid as well as thermal expansion/contraction effects.

A plurality of discrete needles (which may each include an opening 50 and a passageway 55), for example at least thirty-six (36), each with a diameter of 1 mm and separated by 3.9 mm may be effective to pin a meniscus. In an embodiment, 112 openings 50 are present. The openings 50 may be square, with a length of a side of 0.5 mm, 0.3 mm, 0.2 mm or 0.1 mm.

Other geometries of the bottom of the fluid handling structure are possible. For example, any of the structures disclosed in U.S. patent application publication no. US 2004-0207824 could be used in an embodiment of the invention.

As can be seen in FIG. 6, an elongate aperture 61 (which may be slit shaped) is provided outside the openings 50. The elongate aperture 61 may be located further away from the space containing the immersion fluid than the openings 50 arranged in the first line. The aperture 61 may be substantially parallel to the first line in which the openings 50 are arranged. The elongate aperture may form a second line or knife line. The second line may surround the periphery of the shape formed by the openings 50. In an embodiment the elongate aperture is continuous and may completely surround the shape formed by the first line. In use, the aperture 61 is connected to an over pressure source. Gas flowing from the aperture 61 may form a gas knife 60 (e.g., an air knife) surrounding the meniscus pinning system formed by openings 50. The function of this gas knife will be described below. In an embodiment the elongate aperture comprises a plurality of discrete apertures (which may be elongate) along a side 54 of the shape. The plurality of apertures may be arranged in series.

In an embodiment, a liquid handling device is as described hereinabove but lacks the gas knife 60. In such an embodiment, when the substrate table WT moves so that the meniscus of the immersion liquid crosses a lyophilic region, or a region of relatively low lyophobicity (i.e. having a lower contact angle to the immersion liquid than other parts of the substrate or substrate table surface), the immersion liquid may spread out into a film over, the region of low lyophobicity. In the presence of water reference to lyophobicity is to hydrophobicity and lyophilic is to hydrophilic.

Formation of a film may depend on whether the speed of relative movement of the liquid meniscus and substrate or substrate table ("scan speed") is greater than a critical speed. With respect to a meniscus pinned by the openings 50, the critical speed is the relative velocity between the liquid handling structure 12 and the facing surface of a substrate and/or substrate table above which the meniscus may be no longer stable. The critical speed depends on the properties of the facing surface. The higher the contact angle of the facing surface, the higher the critical speed in general. Once a film has begun to form, it may continue to grow even if the substrate has now moved so that the meniscus is over an area with a higher contact angle. For such an area with higher contact angle, the critical speed is higher. If the substrate moves at critical speed of the area with which the meniscus was previously in contact (i.e. a lower contact angle), the scan speed may be lower than the current critical scan speed.

The film may, in some cases after a short delay, break up into large droplets which are undesirable. In some cases, subsequent movements of the substrate table WT may cause the droplets to collide with the meniscus, which may generate bubbles in the immersion liquid. Regions having a relatively low lyophobicity (e.g. in the presence of water hydrophobicity) may include the edge of the substrate, a removable feature such as a planar adherable member (e.g. a sticker) on the substrate table, a positioning feature (e.g. an encoder grid or alignment mark) and/or a sensor (e.g. a dose sensor, an image sensor or a spot sensor). In an embodiment a region of relatively low lyophobicity (e.g. in the presence of water hydrophobicity) may be formed by degradation of a coating or surface treatment. The coating or surface treatment may be provided to increase the lyophobicity (e.g. in the presence of water hydrophobicity) of the surface on which it is provided.

In an embodiment, the gas knife 60 may function to reduce the thickness of any liquid film left on the substrate or substrate table. Reducing the thickness of the film may reduce the likelihood that it breaks into droplets. Additionally or alternatively the gas flow from the gas knife 60 may drive liquid towards the openings 50 and be extracted.

In an embodiment, the gas knife 60 operates to reduce the formation of a film. To achieve this, it is desirable that the distance between the center lines of the gas knife aperture 61 and the meniscus pinning opening 50 is selected from the range of from 1.5 mm to 4 mm, desirably from 2 mm to 3 mm. (In an embodiment, the gas knife aperture 61 has a plurality of apertures 61). The second line along which the aperture 61 is arranged generally follows the first line along which the openings 50 are formed so that the distance between adjacent ones of the aperture 61 and opening 50 is within the aforementioned ranges. The second line may be parallel to the line of the openings 50, although this not necessarily the case as described in U.S. patent application publication no US 2010-0313974, which is hereby incorporated by reference in its entirety.

It may desirable to maintain a constant separation between adjacent apertures 61 (where a plurality of apertures is present along the second line) and adjacent openings 50. In an embodiment this is desirable along the length of the center lines of the apertures 61 and openings 50. In an embodiment the constant separation may be in the region of one of more corners of the fluid handling device.

The gas knife is desirably close enough to the openings 50 to create a pressure gradient across the space between them. There is desirably no stagnant zone in which a layer of liquid (i.e. a liquid film), or a liquid droplet can accumulate, for example beneath the fluid handling structure 12. In an embodiment, the flow rate of gas through the openings 50 may be coupled to the gas flow rate through the elongate aperture 61 as described in U.S. patent application publication no. US 2010-0313974 and U.S. patent application publication no. US 2007-0030464, which are each hereby incorporated by reference in their entirety. The gas rate may therefore be directed substantially inwardly from the aperture 61 to the openings 50. Where the gas flow rate through the openings 50 and the aperture 61 is the same, the flow rate may be referred to as 'balanced'. A balanced gas flow is desirable as it minimizes the thickness of a liquid residue, e.g. film.

As described elsewhere herein, the openings 50 may be arranged to form any closed shape which may include in a non-limiting list, e.g. a quadrilateral such as a parallelogram, a rhombus, a rectangle, a square, or ellipse such as a circle. In each case the aperture 61 for the gas knife 60 may have a substantially similar shape as the shape formed by the openings 50. The separation between the edge of the shape formed by the openings 50 and the shape formed by the aperture 61 is within the aforementioned ranges. In an embodiment the separation is desirably constant.

Figure 8:
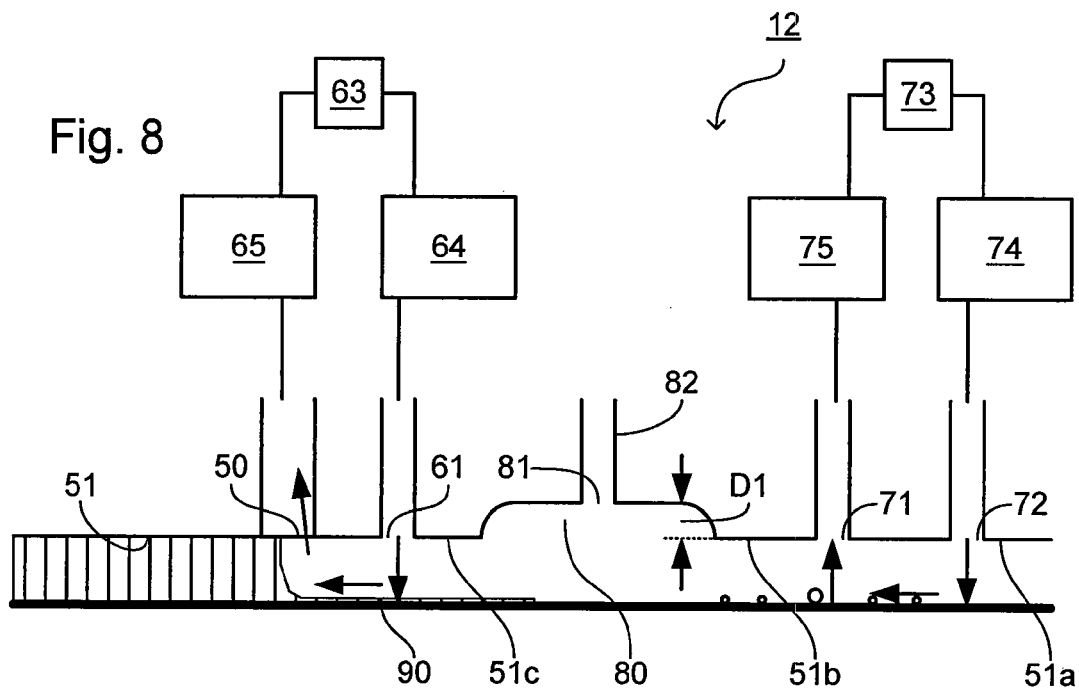
FIG. 8 depicts, in cross-section in a plane substantially perpendicular to a surface under a fluid handling structure, a part of a fluid handling structure according to an embodiment of the present invention.

FIG. 8 schematically depicts in cross-section a part of a fluid handling structure according to an embodiment of the invention. In plan, the fluid handling structure may have any shape, including but not limited to circular, ellipse, oval, triangular, square, rectangular, rhomboid, parallelogram, or a cornered shape with at least two corners, desirably four or more corners. At the boundary between the space 11 in which the liquid is contained and a region that is external to the fluid handling structure, for example in the ambient atmosphere external to the fluid handling structure, a plurality of openings 50 and the aperture 61 may be arranged in the manner discussed above. A plurality of openings 50 may be arranged in a first line for use in extracting liquid from the space into the fluid handling structure. The aperture 61 may be provided in a second line and arranged to form a gas knife device. The gas from the gas knife may force liquid towards the openings 50 in the first line. In an embodiment of the invention, an elongate opening may be provided in the first line in place of the plurality of openings 50 for use in extracting liquid from the space into the fluid handling structure.

One or more openings 71 may be provided in a third line, or droplet line, further away from the immersion liquid than the first and second lines. A second gas knife device is formed by an aperture 72 arranged in a fourth line, or droplet knife line. (In an embodiment, the aperture 72 has a plurality of apertures 72). The fourth line is arranged to be further from the space 11 containing the immersion liquid than the third line. The gas flow through the second gas knife device may be mainly directed inwardly so that most of it passes through the openings 71. In an embodiment the gas flow through the one or more openings 71 and the aperture 72 of the second gas knife device is balanced.

The fluid handling structure of this embodiment includes a first gas knife device operating in conjunction with a first plurality of openings 50. This combination performs the primary extraction of immersion liquid.

The fluid handling structure has a second gas knife device operating with the third line of openings 71. The provision of an additional combination of one or more openings and associated gas knife has been found to be unexpectedly beneficial.

An arrangement such as that depicted in FIG. 7, with a single gas knife device and a single associated line of openings, may leave a residue of liquid on the surface of the substrate W and/or substrate table WT. The liquid residue may be in the form of a liquid film or a plurality of droplets. After a while, the film may break up into a plurality of droplets. The droplets may grow into larger droplets and may become unacceptably large. The liquid residue may be left, as explained herein, when the scan speed exceeds the critical scan speed for a portion of the facing surface. This may, for example, occur when the scan speed increases for a surface with a continuous contact angle beyond the critical scan speed for the surface. The liquid residue may be left in the location of a portion of a surface where the contact angle changes so the critical scan speed for that portion decreases so the scan speed exceeds the critical scan speed, even if the scan speed is constant. Such a portion may be an edge of a feature, such as the edge of the substrate, a shutter member, a sensor or a sensor target, for example at the moment when the liquid meniscus crosses the edge.

In arrangements in which the gas knife device is decoupled from the line of openings 50, 71 by a connection to atmospheric pressure, for example by a space that is connected to atmosphere and is located between the gas knife device and the openings 50, 71, further problems may occur. Liquid may accumulate between the gas knife device and the openings, creating large droplets. When the direction of movement from the substrate W and/or substrate table WT relative to the projection system PS and the fluid handling structure changes, such large droplets may collide with the advancing meniscus of the immersion liquid. The collision of a droplet with the meniscus may cause an inclusion of gas, creating a bubble which may be small or larger. Furthermore, a disturbance of the meniscus caused by the collision may also form a bubble. Formation of a bubble is undesirable. An arrangement as described herein may help reduce one or more of the above or other problems.

The provision in the fluid handling structure of two gas knife devices and associated openings for extraction permits the design and/or setting of process control parameters of each combination to be selected for the specific purpose of each combination, which may be different. The gas flow rate out of the aperture 61 in the second line, forming the first gas knife, may be less than the gas flow rate out of the aperture 72 in the fourth line forming the second gas knife device.

In an embodiment it may be desirable for the gas flow rate for the first gas knife device to be relatively low because, as explained above, the flow through the plurality of openings 50 in the first line is in two phase, with a significant amount of liquid. If the flow rate through the aperture 61 in the second line and the plurality of openings 50 in the first line is in an unstable two phase flow regime, for example the flow rate may be too high, the two phase flow may result in force variations, e.g. vibrations, which is undesirable. On the other hand, the more stable the flow regime, for example the lower the flow rate, through the aperture 61 in the second line and/or the plurality of openings 50 in the first line, the greater the leakage of immersion liquid past the gas knife device at a given speed of movement of the substrate W and/or substrate table WT relative to the projection system PS and the fluid handling structure. Therefore, the gas flow rate in a single gas knife arrangement was essentially a compromise between these two conflicting demands.

The provision in the fluid handling structure of the second gas knife device and associated extraction beneficially enables a lower flow rate to be used for the first gas knife device. The second gas knife device may be used to remove droplets of liquid that pass beyond the first gas knife device. Furthermore, the gas flow rate through the aperture 72 in the fourth line and the one or more openings 71 in the third line may be relatively high. This is because the flow is largely gas. Beneficially, this increased flow rate improves the performance of removal of liquid droplets from the surface of the substrate W and/or the substrate WT.

In an arrangement, the gas flow rate out of the aperture 61 in the second line to form the first gas knife device may be less than or equal to 100 liters per minute, desirably less than or equal to 75 liters per minute, desirably approximately 50 liters per minute or less. In a particular arrangement, the gas flow rate out of the aperture 72 in the fourth line to form the second gas knife device may be greater than or equal to 60 liters per minute, desirably greater than or equal to 100 liters per minute, desirably approximately 125 liters per minute or more.

In an embodiment, a controller 63 is provided to control the rate of flow of gas through the aperture 61 in the second line. In an embodiment, the controller 63 may also control the rate of flow of gas through the openings 50 in the first linea. The controller 63 may control an overpressure source 64 (e.g. a pump) and/or an underpressure source 65 (e.g. a pump, possibly the same pump as provides the overpressure). The controller 63 may be connected to one or more suitable flow control valves in order to achieve the desired flow rates. The controller may be connected to one or more two phase flow rate meters associated with one or more openings 50 to measure the extracted flow rate, a flow rate meter associated with the aperture 61 to measure the supplied gas flow rate, or both. A suitable arrangement for a two phase flow meter is described in U.S. patent application publication no US 2011-0013159 which is hereby incorporated by reference in its entirety.

A controller 73 (which may be the same as the controller 63) is provided to control the rate of flow of gas through the aperture 72. The controller 73 also controls the rate of flow of gas through the one or more openings 71. The controller 73 may control an overpressure source 74 (e.g. a pump) and/or an underpressure source 75 (e.g. a pump, possibly the same pump as provides the overpressure). There may be one or more suitable control valves connected to and controlled by the controller 73 in order to provide the desired flow rates. The controller may control the values based on flow measurements supplied by one or more two phase flow meters arranged to measure the flow through the one or more openings 71, one or more flow meters arranged to measure the flow through the aperture 72, or both. Such an arrangement may be similar to the arrangement for the flow components associated with the first and second lines.

One or both of the controllers 63,73 may be configured to control the gas flow through the openings 50,71 in proportion to the gas flow rate of the corresponding gas knife. In an embodiment, the gas flow rate through the gas knife is up to 20% or up to 10% different from the total flow rate through the corresponding openings 50,71. In an embodiment the gas flow rate through openings 50, 71 may be controlled to match the gas flow rate through the corresponding one or more apertures 61,72. In an embodiment, the gas flow rate through the one or more apertures 61,72 or a gas knife may be substantially the same as the gas flow rate through the corresponding openings 50,71.

Arranging the gas flow rate through the openings 50,71 to match the gas flow rate of the respective gas knife may mean that substantially all of the gas flowing out of the gas knife flows into the corresponding opening 50,71. The gas flow may be inwards, towards the meniscus, or towards the source of the liquid residue. An isolated gas knife generates a substantially symmetric pressure peak, with gas flows in both directions away from that peak. However, because the gas flows are balanced for either or both of the gas knives in an embodiment, the gas knife instead may form a pressure gradient between the one or more apertures 61,72 of a gas knife and the corresponding openings 50,71. There may be little or no gas flow outwardly (rightwards in FIGS. 7 and 8), namely away from the space containing the immersion liquid, from either of the gas knives.

In an embodiment, the controllers 63,73 may control the activation of either or both gas knives such that it is active when it is, or may be, required. In other words, the gas knife may be switched off under appropriate predetermined conditions. For example, the gas knife may be switched off when the scan speed is safely below a critical speed and is switched on when the scan speed goes above, or is likely to go above, the critical speed for the surface currently under the meniscus or approaching the meniscus. For example, when a central portion of the substrate moves under the fluid handling structure 12, one or both of the gas knives may be switched off. The contact angle is constant over this portion of the substrate and the critical scan speed for the portion may be sufficiently high that it is not exceeded. Before, during and/or after the meniscus of the space moves over an edge, for example of the substrate, sensor, shutter member or sensor target, one or both of the gas knife devices may be operational.

Figure 12:
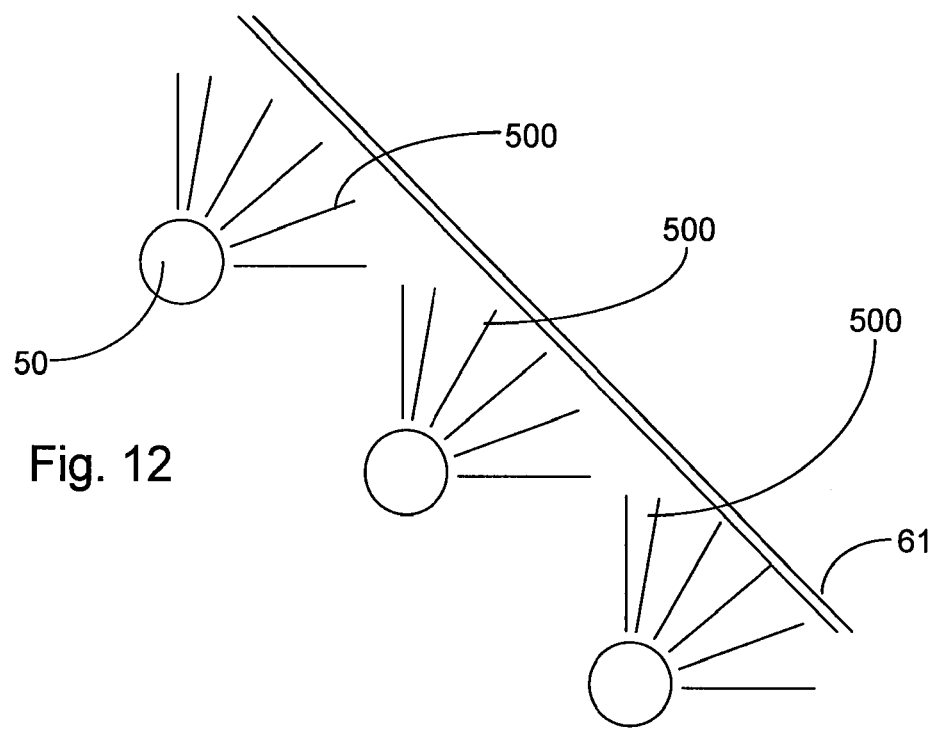
FIG. 12 depicts, in plan, a embodiment of the present invention.

In a configuration of lithographic apparatus, the inner gas knife in particular may not be required for any of the expected modes of operation of the apparatus. Accordingly, in an embodiment, the inner gas knife may be omitted. In such an embodiment, as depicted in FIG. 12, the aperture 61 in the second line may be omitted. There may be no requirement for an over pressure source 64. It should be appreciated that this variation of the apparatus may be applied in conjunction with other embodiments and variations discussed within this application.

The third and fourth lines, along which the one or more openings 71 and the aperture 72 are arranged, may generally follow the first and second lines along which the one or more openings 50 and the aperture 61 are formed. In an embodiment the shape formed by the one or more openings 71 is different from the shape formed by the one or more openings 50. It may be desirable for the third and fourth lines, e.g. in an embodiment the first to fourth lines, are parallel such that there is a constant separation between the lines.

In an embodiment, the width of the aperture 61 in the second line, namely in a direction transverse to the first to fourth lines, is selected from the range of from 40 to 75 desirably approximately 50 μm.

In an embodiment, the aperture 72 in the fourth line, used to form the second gas knife device may have the same features as described with reference to the aperture 61 in the second line. As with the aperture 61 of the first gas knife device, the aperture 72 may be formed as a single slit or as a plurality of elongate apertures. In an embodiment, the width of the aperture 72 of the fourth line, namely in a direction transverse to the first to fourth lines, is selected from the range of from 20 μm to 50 μm, desirably 30 μm.

The one or more openings 71 in the third line may be formed as a single elongate slit or as a plurality of elongate openings. In an embodiment, the width of the one or more openings 71 in the third line, namely in a direction transverse to the first to fourth lines, is selected from the range of from 100 µm to 200 µm, desirably 150 µm. Alternatively, the one or more openings 71 in the third line may be arranged in a similar fashion to the one or more openings 50 in the first line.

In an embodiment, the lower surface 51 of the fluid handling structure may be arranged such that an outer portion 51a of the lower surface extends away from the aperture 72 in the fourth line by at least 2 mm, desirably at least 5 mm. This outer portion 51a of the lower surface 51 of the fluid handling structure may, in conjunction with the surface of the substrate W and/or the substrate table WT, function as a damper, reducing the gas flow away from the one or more openings 71 in the third line. Accordingly, such an arrangement may reduce the leakage of liquid, for example in the form of droplets away from the fluid handling structure, especially at relatively high scan speed.

In the embodiment depicted in FIG. 8, a recess 80 is provided in the lower surface 51 of the fluid handling structure. The recess 80 may be provided in a fifth line, or a recess line, between the second and third lines. In an embodiment, the recess 80 is arranged such that it is parallel to any of the first to fourth lines, desirably at least the second line, the third line or both.

The recess 80 may include one or more openings 81 connected by a gas conduit 82 to atmosphere, such as the ambient atmosphere, for example to a region external to the fluid handling structure. The recess 80, desirably when connected to an external atmosphere, may function to decouple the first gas knife device and associated one or more openings 50 in the first line from the second gas knife device and associated one or more openings 71 in the third line. The recess 80 decouples the operation of the components located either side; so the features radially inward of the recess are decoupled from the features radially outward.

In general, it should be appreciated that the volume of the recess 80 should be sufficiently large in order to provide the desired function of decoupling the first and second gas knives. However, the larger the volume of the recess 80, the greater the likelihood the liquid collecting within the recess and/or the greater the amount of liquid that may collect within the recess 80. Such liquid collecting is undesirable because it may result in the formation of large droplets that are subsequently released onto the surface of the substrate W and/or substrate table WT. Alternatively or additionally, liquid collecting in the recess 80 may collide with the meniscus when there is a change in the scan direction, resulting in one or more of the problems discussed above.

The selection of the size of the recess 80 may be a compromise. In an embodiment, the depth D1 of the recess 80 relative to the lower surface 51 of the fluid handling structure may be selected from the range of from 0.25 mm to 0.75 mm, desirably about 0.5 mm. In an embodiment, the width of the recess 80, namely in the direction transverse to the first to fifth lines, may be selected from the range of from 1 mm to 15 mm, desirably the range of from 1 mm to 10 mm, desirably the range of from 2 mm to 3 mm.

In an embodiment, the size of the recess 80 may be selected primarily in order to ensure the desired function of decoupling the first and second gas knifes. For example, the size of the recess 80 may be larger than the examples provided above. In such an embodiment, additional measures may be taken to reduce the collection of liquid in the recess or to ameliorate the effects of any liquid collected in the recess or both.

On either side of the recess 80, there may be respective portions 51b,51c of the lower surface 51 of the fluid handling structure. The respective portions 51b, 51c may respectively separate the edge of the recess 80 from the edge of the one or more openings 71 in the third line and the aperture 61 in the second line. (Note that these edges of aperture 61 and one or more openings 71 are not the second and third lines, because the lines pass through the center of the cross-sections of the openings; the edges are therefore away from the line.) The portions 51b,51c of the lower surface 51 of the fluid handling structure on either side of the recess 80 may, in conjunction with the surface of the substrate W and/or the substrate table WT, function as respective dampers. Such a damper may assist in ensuring that the gas flows from the first and second gas knives flow towards the respective openings 50,71.

The selection of the size of the portions 51b,51c of the lower surface 51 of the fluid handling structure on either side of the recess 80 may be a compromise. It may be necessary to ensure that the size of the portions 51b,51c of the lower surface 51 of the fluid handling structure are sufficiently large to function as dampers as required. It may be necessary to ensure that the total distance between the second line and the fourth line is greater than a given threshold. This is because the distance between the second and third line may need to be sufficiently large to ensure that the film of liquid 90 breaks up into droplets. Having the distance between the second and third lines at least as large as the given threshold may facilitate removal of the liquid from the surface of the substrate W and/or substrate table WT through the one or more openings 71 in the third line. However, the greater the separation between the edge of the aperture 61 in the second line and the edge of the one or more openings 71 in the third line, the greater the likelihood of liquid collecting and/or the greater the amount of the liquid that will collect under the recess. This may cause difficulties, for example as discussed above.

In an embodiment, the width of the portion 51e of the lower surface of the fluid handling structure, between the recess 80 and the first gas knife device may be at least 1 mm, desirably at least 2 mm. The width of the portion 51c may be the separation between the edge of the aperture 61 in the second line from the nearest edge of the recess 80 in a direction transverse to the first to fifth lines. The portion 51c of the lower surface 51 of the fluid handling structure may be continuous, with no apertures or openings between the first gas knife device and the recess 80.

In an embodiment, the width of the portion 51b of the lower surface 51 of the fluid handling structure between the recess 80 and the one or more openings 71 in the third line may be at least 1 mm, desirably at least 2 mm. The width of the portion 51b may be the separation between the edge of the one or more openings 71 and the nearest edge of the recess 80 in a direction transverse to the first to fifth lines. The portion 51b of the lower surface 51 of the fluid handling structure may be continuous, with no openings or apertures, between the one or more openings 71 in the third line and the recess 80.

In order to help reduce the likelihood of liquid collecting within the recess 80, the recess may be provided with a shape without a sharp edge. The surface may be smoothly rounded. A sharp edge is undesirable because liquid may easily collect. For example, the shape of the recess 80 may be configured such that the minimum radius of curvature at any point around the surface of the recess is at least 0.1 mm, desirably greater than 0.2 mm.

In an embodiment, the size of the recess 80 and the size of the portions 51b,51c of the lower surface 51 of the fluid handling structure on either side of the recess are selected such that the total width of these sections of the fluid handling structure is selected from the range of from 2 mm to 20 mm, desirably selected from the range of from 4 mm to 16 mm. The size of the recess 80 and the size of the portions 51b,51c may be the separation between the aperture 61 in the second line and the one or more openings 71 in the third line.

In an embodiment, a fluid handling structure may include one or more openings in the lower surface 51 of the fluid handling structure that is connected by a gas conduit to atmosphere, such as the ambient atmosphere, for example to a region external to the fluid handling structure. For example, such openings connected to atmosphere may be provided to an embodiment that does not incorporate a recess such as that described above. Such an arrangement may be used to decouple the first gas knife and associated one or more openings 50 in the first line from the second gas knife device and associated one or more openings 71 in the third line.

As discussed above, liquid collecting on the lower surface 51 of the fluid handling structure, in particular between the aperture 61 in the second line and the one or more openings 71 in the third line, may be undesirable. The collected liquid may cause problems when the direction of relative movement of the substrate W and substrate table WT with respect to the projection system and the fluid handling structure changes. In an embodiment, a lithographic apparatus that includes a fluid handling structure described herein may include a' controller PWC that is arranged to control the actuator system of a positioner PW configured to move the substrate table WT and a substrate W held thereon.

The controller PWC may be configured such that if the speed of the substrate table WT relative to the projection system PS is above a particular velocity, steps are taken to reduce the problems that may be caused by the collected liquid as discussed above. The speed may be selected to correspond to a critical velocity of the first gas knife device for example with respect to a portion of the facing surface, or slightly below this critical velocity. The critical velocity may be considered as a velocity of the substrate table WT relative to the projection system PS at which immersion liquid leakage through the gas knife, for example radially outwards, exceeds a given amount. It will be appreciated that such a critical velocity may be dependent on the configuration of the gas knife device, the gas flow rate of the gas knife device and/or the nature of the surface of the substrate and/or substrate table WT at that point.

The speed of the substrate table WT relative to the projection system PS may be above the given speed. It may be required to change the direction of movement of the substrate table relative to the projection system. In an embodiment, the controller PWC is configured such that if the speed is above the given speed and it is required to change direction of the movement of the substrate table, the controller PWC first reduces the speed of the substrate table relative to the projection system PS below the given speed. The controller PWC may then initiate the change of direction. Accordingly, the change of direction no longer occurs above, for example, the critical velocity of the first gas knife device, minimizing or reducing the problems caused by immersion liquid that may have collected between the first and second gas knife devices.

The use of a fluid handling structure 12 such as that depicted in FIG. 8 may permit scanning speeds of a table, such as the substrate table WT, relative to the projection system PS of 1 m/s without leaving droplets on the substrate that are larger than 70 µm. In contrast, an arrangement with a single line of openings and associated gas knife device operating at a similar scan speed may result in droplets of up to 300 µm being left on a facing surface, such as the substrate W. Thus, the performance of a fluid handling structure according to an embodiment of the present invention may be improved in comparison to previous arrangements at locations at which the meniscus crosses the edge of a feature, such as at an edge for example of a substrate, and/or crosses a lyophilic region (the lyophilic region may be hydrophilic with respect to water). Application of an embodiment of the invention may help reduce the loss of immersion liquid and/or reduce cause of disturbance forces.

Another type of fluid handling device is the so called single phase extractor. A single phase extractor may operate to extract two phase fluid. A so called single phase extractor comprises a porous member, for example a micro-sieve, which is connected to an under pressure source. Liquid is extracted through those pores covered in liquid but no extraction occurs through those pores not covered by liquid but covered by gas. A meniscus of liquid extends over each of the pores covered by gas and the capillary force of that meniscus prevents the liquid in the pore from being extracted. In this way single phase extraction is encouraged. This has advantages in terms of the reduction of vibrations in the fluid handling structure. Such a fluid handling structure is described, for example in US 2006-0038968.

An embodiment of the present invention can be used in conjunction with any of the fluid handling structures mentioned above. An embodiment of the present invention is directed towards minimizing the chance of any droplets which do escape from coalescing to form larger droplets. When the meniscus of liquid which defines the radially outward position of the space in which immersion liquid is present and which extends between the substrate W and/or substrate table WT and the fluid handling structure 12 collides with a droplet on the surface, a gas bubble can be included into the immersion liquid in the space. Such a gas bubble is typically stationary with respect to the substrate W and can therefore end up in an exposure area so that any exposure of that area will contain a imaging error due to the presence of the bubble.

Figure 9:
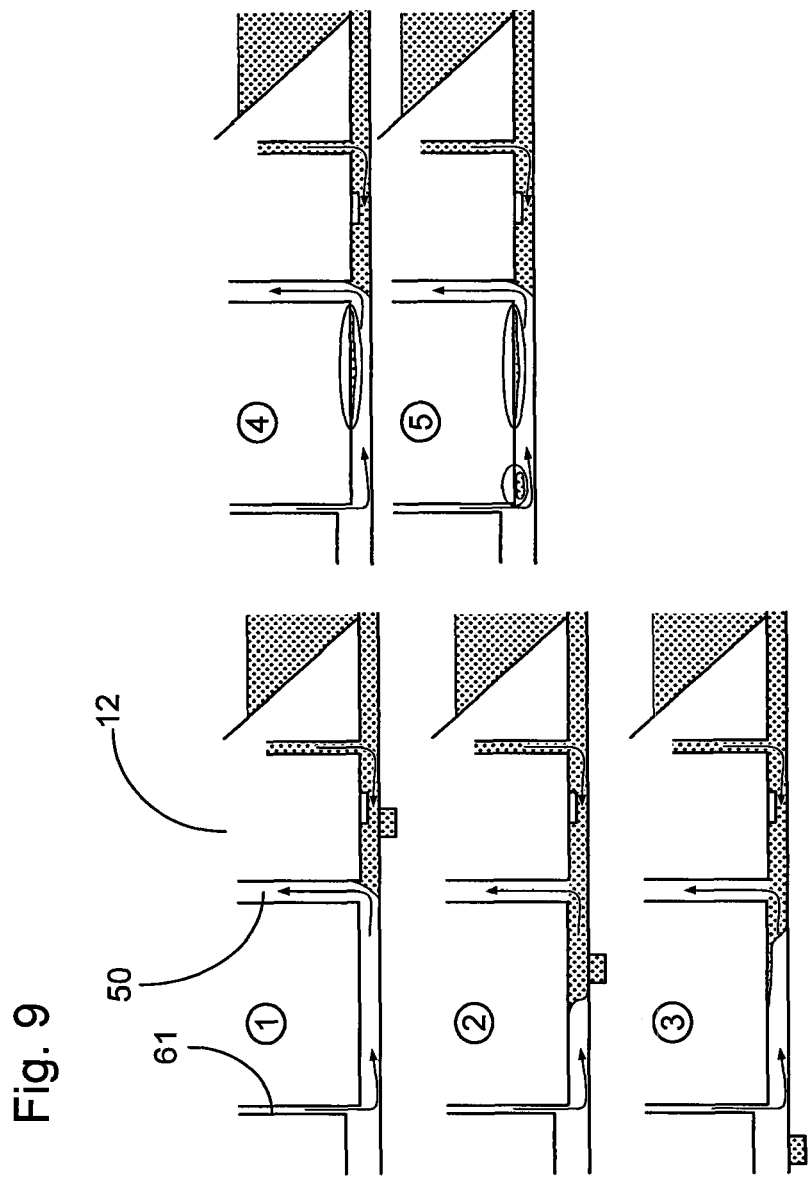
FIG. 9 illustrates schematically, in cross-section, an origin of liquid loss from the space.

FIG. 9 has five illustrations (FIGS. 9.1 to 9.5) illustrating a mechanism in which liquid can be lost from the immersion space 11. This is, for example, during crossing of the edge between the substrate W to a surface of the substrate table WT. Between the surface of the substrate table WT and the surface may be a gap in which may be located a fluid extractor. The fluid extractor may remove liquid which enters the gap, gas which is trapped in the gap (and which may escape into an immersion space 11 located above the gap when the gap passes under the immersion space), or both. An embodiment of such a fluid extractor is a bubble extraction seal (BES). The fluid extractor may have an under pressure source which generates an under pressure in the gap. The same mechanism as illustrated in FIG. 9 may lead to liquid loss at other changes in height on any table. For instance, a change in height may be present between the edge of a sensor and a table on which the sensor is located, for example mounted. In an example the table may be a measurement table. In an embodiment the table may be a table used to swap one substrate for another under the projection system.

The droplets, which may cause big bubbles, may be formed from liquid which is lost from the immersion space 11 as the substrate edge passes under the space 11. Some of these droplets are created by the meniscus locally remaining attached to the BES (see FIG. 9.2). When this part of the meniscus retracts towards the extractor 50, a film may form on the gas damper surface (where the gas is air, an air damper) of the fluid handling structure. The gas damper surface is an area of the fluid handling structure 12 between extractor 50 and the gas knife opening 61. The film may form because of the low receding contact angle of the surface of the fluid handling structure 12 which may be made of stainless steel (see FIG. 9.3). Depending on where the film is formed, it is extracted via the extractor 50, or it is transported towards the gas knife opening 61. The two extraction regions may occur because of the recirculation zone which exists, in use, below the gas knife opening (See FIGS. 9.4 and 9.5). If a droplet located below the gas knife opening grows too large, small droplets may be released. The small droplets may eventually form one or more big bubbles.

An embodiment of the present invention is directed to a liquid manipulator (e.g. a structure) which may be present radially outwardly of the extractor. The liquid manipulator may help prevent small droplets from coalescing into large droplets on a surface (e.g. on the gas damper surface). In an embodiment the liquid manipulator aids in the removal of droplets from the surface towards the extractor. In an embodiment, the liquid manipulator is passive, for example it does not have any moving parts.

In an embodiment the liquid manipulator makes the coalescence of droplets into large droplets less likely and/or transports a droplet on the surface to the extractor and/or, if the extractor is a plurality of extraction openings 50 in a line, reduces the chance of a droplet on the gas damper from passing between two extraction openings 50. In an embodiment, the liquid manipulator helps to transport a droplet towards the extractor 50.

Figure 10:
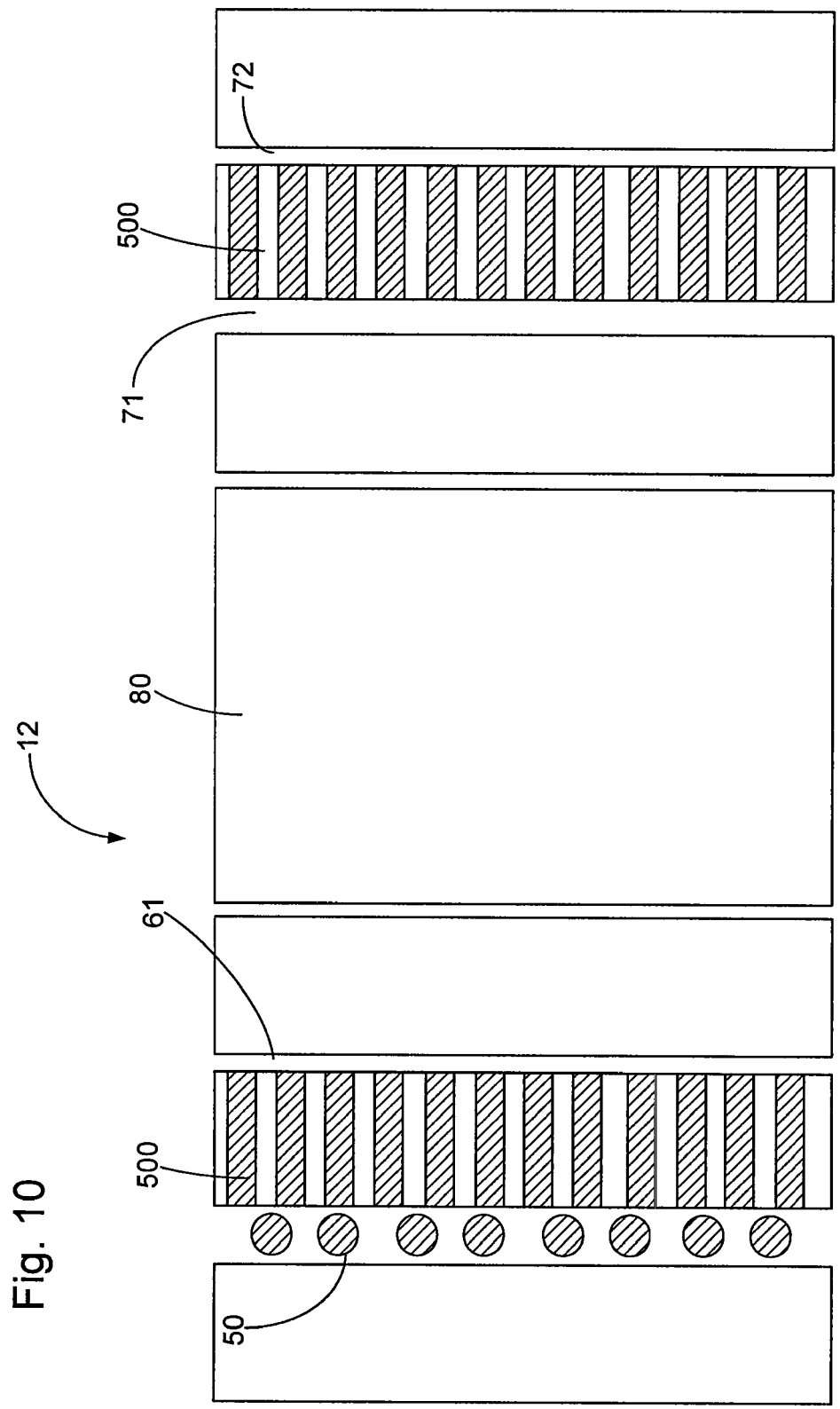
FIG. 10 illustrates, in plan, one embodiment of the present invention in which coalescence of lost liquid droplets is hindered.

FIG. 10 illustrates schematically a solution in which droplets are prevented or reduced from coalescing into large droplets.

An embodiment of the invention involves a plurality of grooves 500 (or a series of grooves) in a part of the undersurface of the immersion hood between an array of (needle liquid) extraction openings 50 (for example two phase extraction openings) and at least one gas knife opening 61. The grooves 500 are at least partly aligned in a radial direction i.e. have a direction with a component which is aligned with the radial direction (e.g. for a liquid confinement structure 12 which is circular in plan) or with a component perpendicular to the linear array of extraction openings 50 and/or gas knife opening 61. The grooves are elongate and aligned in a direction which passes through the space 11. In an embodiment the direction passes through the center of the space. In an embodiment the grooves are substantially co-aligned and/or are angled relative to the (optionally elongate) extractor and/or gas knife opening 61.

Two areas may be provided with grooves 500. The two areas are: the area immediately radially outwardly of the opening 50; and the area immediately radially inwardly of an outer gas knife 72.

Variations can include grooves 500 with different cross-sections in the elongate direction, for example straight, saw toothed, corrugated, sine shaped, or asymmetric shape.

Due to scanning of an edge like the edge of a substrate (for example, a gap between the edge of a substrate and the surrounding table) under the liquid confinement structure 12, a droplet can be trapped on the gas damper surface of the liquid confinement structure 12, for example between gas knife 61 and extraction openings 50. Such a droplet can grow by coalescence. A droplet which is too large becomes unstable, falling off the surface of the liquid handling structure, hitting the substrate W. If such a collision takes place with the advancing meniscus of the immersion space 11, a big bubble defect may be caused. In the twinline concept (as described with reference to FIG. 8 so called because of the use of two substantially parallel gas knives) a droplet can be trapped in the area between an outer gas knife opening 72 and an extraction opening 71.

An embodiment of the invention may result in a significant reduction of the amount of trapped droplets between gas knife 61 and extraction openings 50. The embodiment has small grooves 500 aligned in a direction with a component substantially perpendicular to the line of extraction openings 50 between the gas knife 61 and extraction openings 50.

The groove 500 helps to avoid movement of droplets in a direction parallel to the gas knife 61. The groove 500 may help to reduce, if not prevent, coalescence of small droplets resulting in bigger droplets. In an embodiment the groove 500 keeps droplets on the surface between the gas knife 61 and extraction openings 50 and conducts the droplets to the extraction openings 50.

Furthermore, the groove 500 may help guide a droplet towards the extraction openings or slit 50. This is possible because of capillary effects or due to local pressure gradients.

In an embodiment, the groove 500 may comprise a grooved surface of coarse grooves with a depth of 60 μm and a pitch of 120 μm between the grooves. A suitable groove depth is 30-90 μm and a suitable groove pitch is 80-160 μm. The grooves may have similar depth. The grooves may be periodically positioned in the surface.

Two or more sizes of groove may be employed. These are coarse and fine grooves. Coarse grooves can be seen as guidance grooves. Coarse grooves dynamically guide flow of liquid along them. Fine grooves enhance the hydrophobic or hydrophilic nature of the surface. Therefore, fine grooves can be used where a lyophobic (e.g. in the presence of water hydrophobic) or a lyophilic (e.g. in the presence of water hydrophilic) surface is required in order to enhance that surface property. Fine grooves can make use of capillary forces to transport immersion liquid to the extraction openings 50. Fine grooves desirably have a cross sectional dimension (depth and/or width) of 0.1-2 μm.

Coarse grooves desirably have a cross-sectional dimension (depth and/or width) of 30-90 μm. For coarse grooves the property of the grooves is dominant over the lyophobic (e.g. in the presence of water hydrophobic) or lyophilic (e.g. in the presence of water hydrophilic) nature of the surface. Usually, but not exclusively, coarse grooves are used in combination with a lyophobic (e.g. in the presence of water hydrophobic) surface. In that case the droplets can be held by a barrier and the grooves can guide liquid flow. Coarse grooves can aim to prevent one or more of: a droplet of immersion liquid being transported parallel to the gas knife 61 and/or the elongate direction of the extractor (e.g. line of extraction openings 50); and/or a droplet of immersion liquid being transported between adjacent extraction openings 50. In an embodiment grooves with a size between the fine and coarse grooves are present and which function in a combination of the ways described above.

In the embodiment of FIG. 10 the grooves 500 may be coarse grooves with the inside of the groove desirably being lyophilic to the immersion liquid (that is, in an embodiment, immersion liquid has a receding contact angle with the immersion liquid of less than 70°). The liquid may be guided towards the line of extraction openings 50/71.

In an embodiment the grooves 500 of FIG. 10 may be fine grooves. For fine grooves, the inside of the groove is desirably lyophilic to the immersion liquid. In an embodiment immersion liquid may have a receding contact angle with it of less than 70 degrees. This may encourage droplets to smear out and form a film on the surface so that the liquid can be removed from the surface as a film through extraction openings 50/71.

In an embodiment only fine grooves are present. In an embodiment only coarse grooves are present. In an embodiment both fine and coarse grooves are present. FIGS. 11-14 show various different embodiments. In an embodiment the grooves are radial to the extraction openings 50. The grooves may extend in a such a direction to guide liquid to an extraction opening 50. Coarse grooves may be perpendicular to the line of extraction openings 50. However, such an arrangement for fine grooves, in an embodiment, may be undesirable because the arrangement may lead to liquid leaking through the gaps between the extraction openings 50.

An intermediate size of groove may be used in an embodiment. Such an intermediate groove is useful both to transport immersion liquid in a particular direction (e.g. towards an extraction opening 50), to hinder movement of a droplet between adjacent extraction openings 50, or both. For a system shaped, in plan, with corners (for example such as illustrated in FIG. 6), more grooves will be present which may lead to the extraction openings 50 at the corners than for other extraction openings 50 (e.g. the extraction openings 50 arranged in a substantially straight line).

Figure 11:
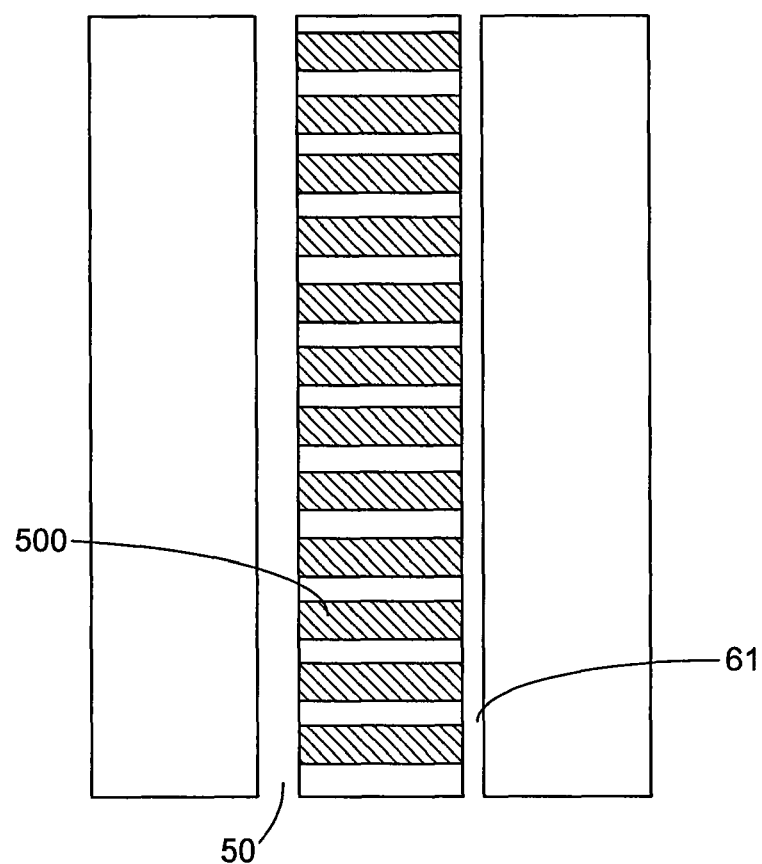
FIG. 11 depicts, in plan, an application of an embodiment of the present invention to the fluid handling structure of FIG. 8.

FIG. 11 illustrates schematically the use of grooves 500 in the fluid confinement structure 12 illustrated in FIGS. 6 to 8.

A typical dimension of a surface between the openings 50 and the gas knife opening 61 is about 1 mm, for example between 0.5 and 1.5 mm.

The purpose of an embodiment of the invention is to solve essentially the problem described above herein. The grooves are intended to reduce or prevent droplets from coalescing into a large droplet on the surface of the fluid handling structure 12 between the extraction openings 50 and the gas knife opening 61. The grooves may guide the droplet to the extraction openings 50. This helps hinder the formation of a large droplet between the extraction openings 50 and the gas knife opening 61 for example as a result of gas flow recirculation near the gas knife opening 61 and/or a droplet created when the edge of the substrate passes beneath the immersion space, e.g. crossing the gap around the edge of the substrate W. A droplet which would otherwise form on this surface could later collide with the immersion liquid meniscus of the liquid in the immersion space 11, introducing a bubble into the space.

The grooves may be formed by removing material from the surface in which the grooves are formed. Alternatively or additionally, the grooves may be formed by adding material to the surface (i.e. by depositing ridges). In one embodiment, poly(methyl methacrylate) (PMMA) is deposited on the surface to form the grooves between ridges of the patterned PMMA.

A potentially undesirable feature of the extraction system illustrated in FIG. 7 is that the gas flow radially inwardly leaving the gas knife opening 61 is greater closer to the substrate W than closer to the surface of the liquid handling structure 12. Thereby a droplet on the surface of the liquid handling structure 12 may not have as large a force applied to it by the gas flow as a droplet on the facing surface.

FIG. 12 shows an embodiment of the fluid confinement structure 12. FIG. 12 is a view, in plan, of an under surface of the fluid confinement structure 12. The under surface is the surface which, in use, faces the facing surface which may be, for example, a substrate W or a table such as a substrate or measurement table. The fluid confinement structure 12 of FIG. 12 is of the type illustrated in FIG. 6. However, the principles are equally applicable to the type of fluid confinement structure 12 illustrated in FIG. 8. The extraction openings 50 in FIG. 12 may be the extraction opening 71 of FIG. 8. The gas knife opening 61 of FIG. 12 may be the gas knife opening 72 of FIG. 8.

In the embodiment of FIG. 12 the liquid manipulator is a structure that reduces the chance of droplets on the surface between the gas knife 61 and the line of extraction openings 50 from coalescing. The liquid manipulator is in the form of a series of grooves 500 in the surface. The grooves 500 may be formed by removing material from the surface or by adding material to the surface, as described above. The grooves 500 are elongate. The elongate direction of the grooves 500 passes through the space 11. In an embodiment the grooves 500 are such that they aid in the removal of droplets from the surface towards an extraction opening 50.

In an embodiment, as illustrated in FIG. 12, each extraction opening 50 has at least one groove 500 associated with it. The associated groove 500 is elongate in a direction which passes through its associated extraction opening 50. Capillary action of the grooves 500 on a droplet may be effective to draw a droplet along the groove 500 towards the extraction opening 50. The gas flow from the gas knife 61 to the extraction openings 50 may provide an additional or alternative force to move the droplet along the groove 500.

In an embodiment the grooves 500 of FIG. 12 which are associated with an extraction opening 50 are of the fine type of groove and are lyophilic. In this way droplets of liquid landing on the grooves 500 are spread out and can be removed by the openings 50 as a film.

In an embodiment the grooves 500, or at least some of the grooves 500, associated with an extraction opening 50 are not of the fine size. For example, one or more grooves 500 associated with an extraction opening 50 may be of the coarse type of groove. In an embodiment, the grooves 500 help prevent droplets from coalescing by trapping droplets on the surface in the groove 500. The grooves 500 are made to be lyophilic. The grooves 500 guide the droplets towards the extraction opening 50. The flow of gas from the gas knife 61 to the extraction opening 50 is effective to move the droplets along the groove 500 towards the associated extraction opening 50. In an embodiment, the grooves hinder coalescence of droplets by restricting the ability of the droplet to move in a direction parallel to the gas knife 61 and/or line of extraction openings 50.

FIG. 13 illustrates an embodiment which is the same as the embodiment of FIG. 12 except as described below. In FIG. 13 the extraction openings 50 form a line which is, in plan, a cornered shape (as for example illustrated in FIG. 6). The extraction opening 50A at a corner has associated with it more grooves 500 than the other extraction openings 50 which are located along the side of the cornered shape, i.e. not at a corner.

A series of grooves 600 are present between adjacent extraction openings 50. The grooves 600 are elongate. The elongate direction of the grooves 600 has a component parallel to the line of extraction openings 50. In an embodiment the grooves 600 between adjacent extraction openings 50 are parallel to the line of extraction openings 50. The grooves 600 are configured to reduce the chance of a droplet of liquid passing between adjacent extraction openings 50 in a direction having a component perpendicular to the line of extraction openings 50. For this purpose the grooves 600 are desirably of the coarse type and are lyophobic (that is, the immersion liquid has a receding contact angle with it of greater than, for example, 70° or desirably 90°, or desirably 100°). Thus, droplets encountering the grooves 600 are held in place and the grooves act as a droplet barrier. In an embodiment large contact angle hysteresis is present and this helps prevent droplets from moving further inward. The grooves 600 may serve to block the flow of the liquid of a droplet at a location radially outward from the immersion space 11.

In an embodiment the grooves 600 may be of the fine or an intermediate type. If the grooves are lyophilic droplets in contact therewith are spread out and can be extracted by the extraction openings 50 as a film. Capillary action can act on a droplet and direct it towards one or other of the extraction openings 50 between which the grooves 600 are positioned.

In an embodiment the grooves 600, which are associated with an extraction opening 50, are of the fine type of groove and are lyophobic. For example, the grooves 600 associated with an extraction opening 50 may have a depth and/or width of between 0.1-2 μm. For a coarse scale groove, the liquid droplet flow may be guided by dynamic interaction between the non-smooth surface and the liquid droplet. In any event, the size of groove may be chosen such that liquid does not enter the groove and gas stays in the groove between projections to make the surface function as a lyophobic surface. If the fine or intermediate grooves 600 are lyophobic the grooves may act to help prevent droplets from moving past the grooves 600.

In one embodiment, a liquid confinement structure 12 comprises only grooves 600 between extraction openings 50 and does not comprise grooves 500 as illustrated in FIG. 12 or 13.

Figure 14:
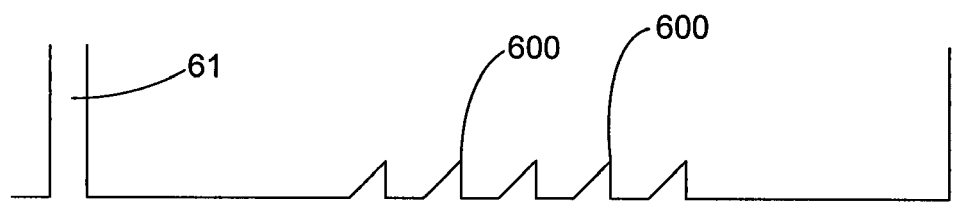
FIG. 14 depicts, in cross-section in direction 610 of FIG. 13, an embodiment of the present invention.

As discussed above, the grooves 500, 600 may have a cross-sectional shape in the elongate direction which is not planar. An example is illustrated in FIG. 14. FIG. 14 is a cross-section through the liquid confinement structure 12 of FIG. 13 along the direction perpendicular to the line of openings 50. As illustrated, each groove 600 has the cross-sectional shape of a right angled triangle. The hypotenuse of the right angled triangle is on the side of the gas knife 61. The perpendicular of the right angled triangle is on the side closer to the space 11. In this way for a droplet moving towards the space 11, it is encouraged to enter the groove 600 but discouraged by the perpendicular surface of the triangle from moving out of the groove 600 towards the space 11. The surface may have preferred direction for the flow of liquid over the surface.

Other cross-sectional shapes of groove which may be appropriate include, but are not limited to: ellipsoid or semi-circular or square or rectangular or trapezoid or a parallelogram.

FIGS. 15-20 extend the idea of the use of grooves to the use of grooves in a single phase extractor, such as described above and in, for example, US 2006-0038968. Such a single phase extractor is comprised of a porous member 700 on the bottom or under surface of the fluid confinement structure 12 which faces a facing surface such as a substrate W or a table and surrounds the space 11, in use. An under pressure is applied to a chamber 710 on the opposite side of the porous member 700 to the facing surface.

Immersion liquid passes through pores of the porous member 700 covered in immersion liquid. Those pores not covered in immersion liquid (i.e. radially outward of the meniscus 90 extending between the porous member 700 and the facing surface), are blocked by a meniscus of liquid extending across each of the pores. The surface tension of that blocking liquid, in single phase extraction mode, is greater than the under pressure applied to the chamber 710.

In order to increase the rate of extraction through the porous member 700 (for example to reduce the risk of liquid escaping from the space 11), a higher under pressure is applied to chamber 710. This can be disadvantageous and lead to undesirable two phase flow.

Figure 19:
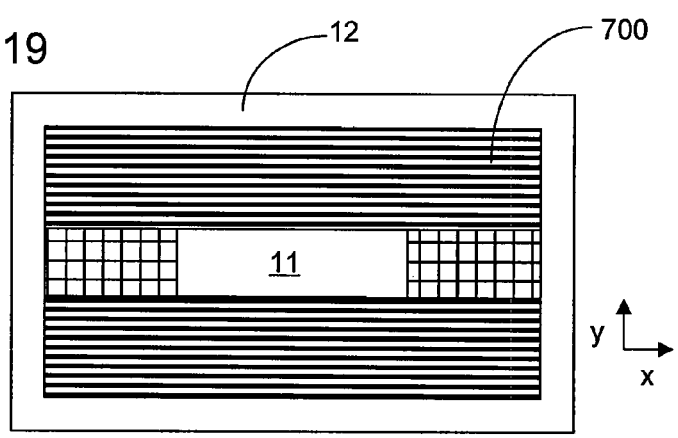
FIG. 19 depicts the fluid handling structure of FIG. 15 in plan.
Figure 20:
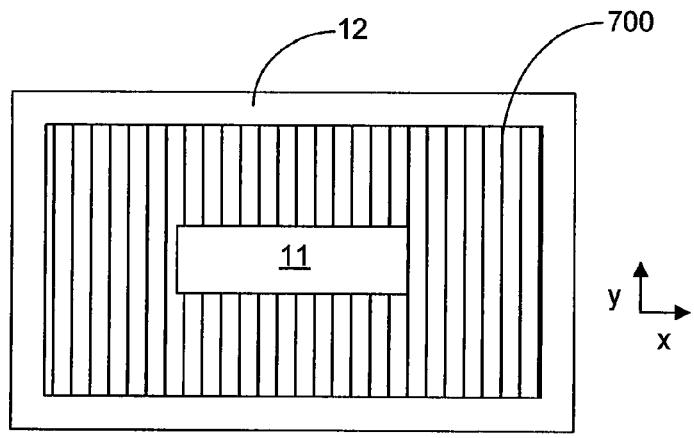
FIG. 20 depicts an alternative embodiment of FIG. 19.

In the embodiments of FIGS. 15-20, the total surface area of the porous member 700 is increased without increasing its footprint, in plan. This is achieved by forming grooves in the porous member 700. Put another way, at least one recess and/or protrusion is formed in a surface of the porous member 700 which faces the facing surface. By increasing the surface area of the porous member 700, a higher extraction rate is achieved for the same under pressure. Thus, immersion liquid can be extracted in a true single phase flow, thereby avoiding pulsations resulting from two phase flow and resulting in lower equipment weight. Additionally or alternatively, providing grooves/corrugations in the porous member 700 leads to an increase in the rigidity of the porous member 700 and of the liquid confinement structure 12 in general. The grooves/corrugations may be formed with an elongate direction in the scanning or stepping directions and may be formed over the whole or part of the porous member 700 (as illustrated in FIGS. 19 and 20). In an embodiment the grooves/corrugations may be formed in a shape substantially the same or similar to a shape of the space or the openings 50, 71, in plan.

In an embodiment the at least one recess and/or protrusion is part of at least one groove. In an embodiment the porous member 700 has a plurality of grooves. In an embodiment the grooves are substantially parallel. A plurality of substantially parallel grooves may form corrugations in an embodiment. In an embodiment at least part of the surface of the porous member 700 is substantially flat.

Figure 15:
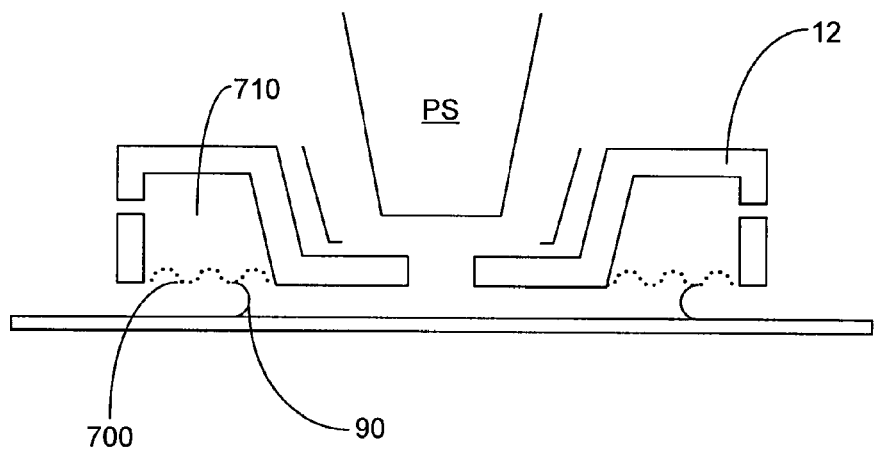
FIG. 15 depicts, in cross-section, an embodiment of the present invention.
Figure 16:
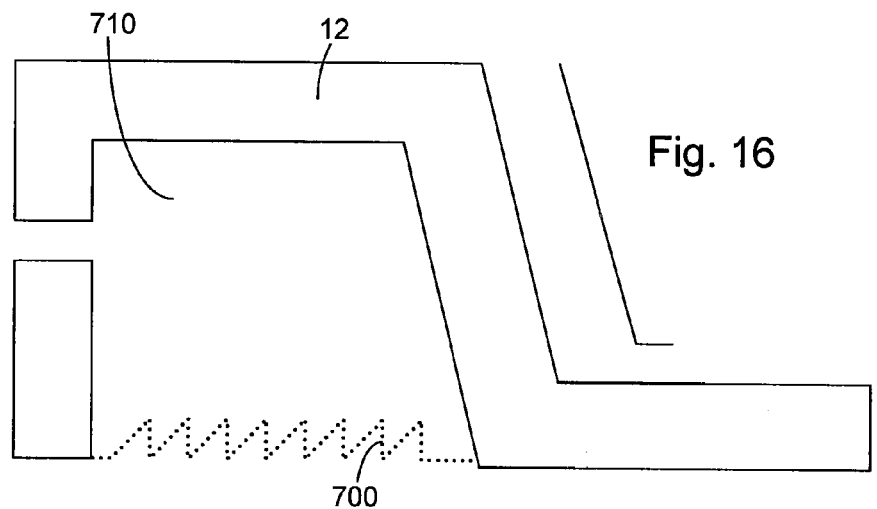
FIG. 16 depicts, in cross-section, an embodiment of the present invention.
Figure 17:
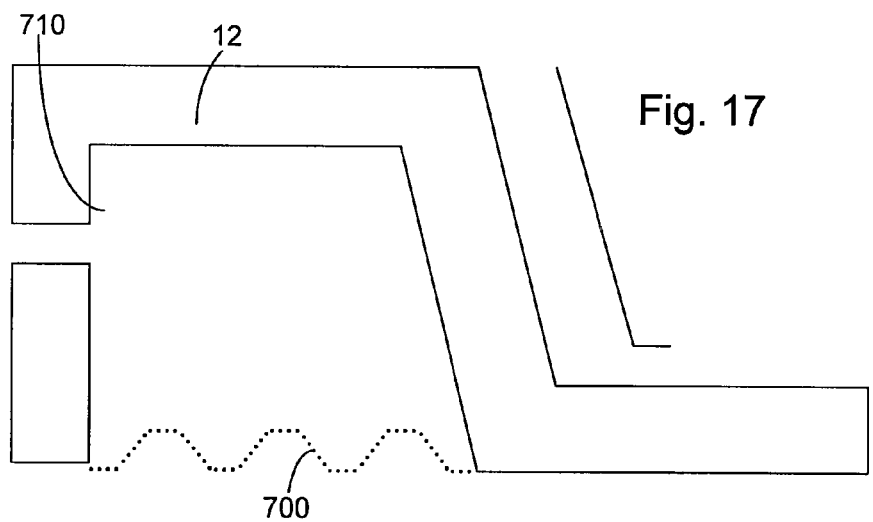
FIG. 17 depicts, in cross-section, an embodiment of the present invention.
Figure 18:
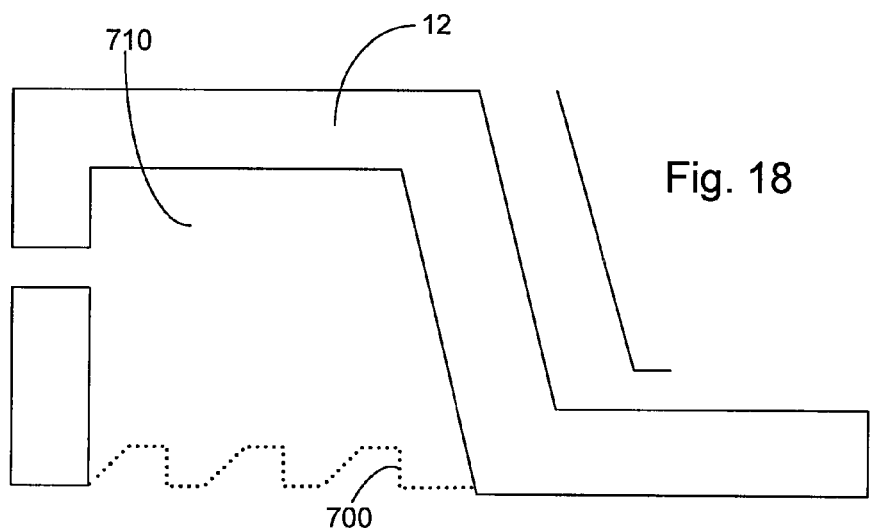
FIG. 18 depicts, in cross-section, a fluid handling structure according to an embodiment of the present invention.

In the embodiment of FIG. 15 the grooves have a cross-sectional shape of a sine wave. However, as illustrated in FIGS. 16, 17 and 18 other shapes may be suitable such as right angled triangles (with the hypotenuse facing away from the space 11) as illustrated in FIG. 16. As illustrated in FIGS. 17 and 18 the grooves may have a cross-sectional shape of a trapezium. In an embodiment the trapezium is a regular trapezium (FIG. 17). In an embodiment the trapezium is an irregular trapezium (FIG. 18). One side of the trapezium is at right angles to the base. That side is nearest to the space 11.

FIG. 19 shows the porous member 700 in plan surrounding the space 11. The porous member 700 is flat on either side of the space 11 in the x direction. On either side of the space 11 and on either side of the flat portions of the porous member 700, in the y direction, grooves exist. The grooves have an elongate direction aligned with the x direction.

In an alternative embodiment, the corrugations are aligned in the y direction, as illustrated in FIG. 20. In FIG. 20 the whole of the porous member 700 is corrugated.

In an embodiment the liquid manipulator helps prevent the formation of droplets. By applying a liquid manipulator in the form of a lyophobic material at the gas damper surface (the surface of the liquid handling structure 12 facing the substrate and/or a table radially outward of the extractor 50), the immersion liquid film on the gas damper is less likely to be formed due to the higher receding contact angle (~70° or 90° versus 0°), when the meniscus recedes. Therefore less liquid will be left on the gas damper, which will result in less liquid accumulation. Droplets left behind or coming into contact with the gas damper may bounce off because of the lyophobic nature of the surface of the gas damper. The droplets will end up on the substrate or substrate table because of gravity. However, the droplets will not coalesce into bigger droplets before detaching from the gas damper. This means that the chance of getting big bubbles included into the space as a result of the droplets colliding with the meniscus is smaller than when no liquid manipulator is present. A droplet on the liquid manipulator can be prevented from moving radially inward by a groove or grooves as illustrated in and described with reference to FIG. 10.

Partial de-wetting of the liquid manipulator when the meniscus is pinned at a feature (for example the edge of the substrate or edge of the substrate table during crossing of the edge of the substrate), is less likely. This is because the contact angle which the meniscus makes with the lyophobic or superlyophobic (e.g., hydrophobic or superhydrophobic) coating is much greater so that the meniscus takes up a S shaped profile in cross-section compared to the C shaped profile when the gas damper is lyophilic (e.g., hydrophilic) as is usually the case. If there is a transition from lyophobic or superlyophobic to lyophilic (as described in some embodiments below) the shape of the meniscus, in cross-section, will change as the meniscus passes over the boundary between the lyophobic/superlyophilic and lyophilic areas.

Because a lyophobic or superlyophobic coating has very low contact angle hysteresis compared to bare stainless steel, partial de-wetting after crossing a pinning feature can be reduced.

Furthermore the contact angle hysteresis in an embodiment of the present invention is typically smaller than for stainless steel (which may be used to make a fluid handling structure), so less force is needed to displace a droplet. For stainless steel the contact angle hysteresis is typically in the order of 50-70 degrees depending on the roughness and pretreatment of stainless steel. For several hydrophobic materials/coatings the hysteresis can easily be decreased to a value of ~20 degrees. This hysteresis is a measure for the stickiness of the droplet, so the droplet will be less sticky on such lyophobic surfaces.

Examples of such coatings are polydimethylsiloxanes, also known as Lipocer™, and coatings with a fluoropolymer, for example teflon.

The coating may be a superlyophobic (e.g., superhydrophobic) coating. A superlyophobic coating may have an initial receding contact angle of, for example, 160°, from 120° and could be up to 180°. After working the receding contact angle could decrease to about 100°. This compares to a normal lyophobic coating which has an initial receding contact angle of 90-95° but which can go down as low as 60° during working or perhaps be in the range 70-95°.

Various techniques may be used to deposit superlyophobic coatings, often in the form of thin films. They include chemical vapor deposition of poly(tetrafluoroethylene) (PTFE), carbon nanotubes and walls, modulated RF glow discharge, microwave PECVD, self-organization of fluorinated polymers, etc. In general, fluorocarbon compounds are found to be water and oil repellent, due to their lower surface energies. Teflon is a fluorocarbon compound and Teflon-like coatings are deposited by different methods. The methods include polymerization of fluorocarbon precursors in radio frequency plasma, ion beam sputtering, and RF sputtering. More details can be found in the article by A. Satyaprasad, V Jain and S K Nema entitled "Deposition of superhydrophobic nanostructured Teflon-like coating using expanding plasma arc" in Applied Surface Science 253 (2007) 5462-5466, which is hereby incorporated in its entirety by reference. Xue-Mei Li, David Reinhoudt and Mercedes Crego-Calama discuss in "What do we need for a superhydrophobic surface? A review on the recent progress in the preparation of superhydrophobic surfaces" in Chemical Society Reviews 2007, 36, 1350-1368, which is hereby incorporated by reference in its entirety, techniques for applying superhydrophobic coatings. The article by Paul Roach, Neil Shirtcliffe and Michael Newton entitled "Progress in superhydrophobic surface development" in Soft Matter, 2008, 4, 224-240, which is hereby incorporated in its entirety by reference, also discloses techniques for applying superhydrophobic coatings.

An advantage of a hydrophobic surface is that it is less vulnerable for contamination build-up.

Figure 21:
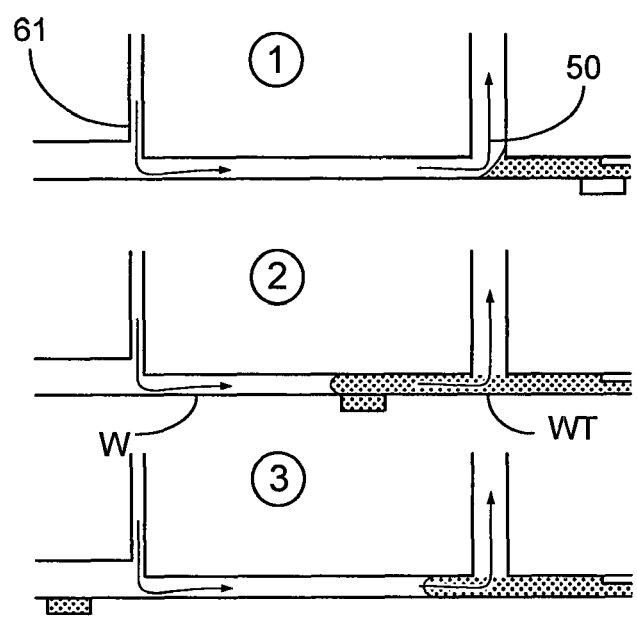
FIG. 21 illustrates schematically, in cross-section, how one embodiment of the present invention can reduce the chance of liquid loss.

FIG. 21 illustrates an embodiment in which the surface is made to be lyophobic to immersion liquid. The material on the surface of the fluid handling structure 12 between the extraction opening 50 and the gas knife opening 61 (so called the gas damper) is made (e.g. by coating) so that the immersion liquid has a receding contact angle of greater than 70°, desirably greater than 90°, more desirably greater than 100', yet more desirably greater than 110°, 120°, 130° or 140°. The surface may be hydrophobic or superhydrophobic. In an embodiment the immersion liquid has a contact angle of greater than 150° to the surface of the gas damper.

The lyophobic coating extends from the gas knife opening 61 to any point between the gas knife opening 61 and the linear array of extraction openings 50.

Better results may be achieved if the lyophobic coating covers all of the surface between the extraction openings 50 and gas knife opening 61.

A lyophobic coating may be applied in an arrangement which does not have a gas knife 61, and which may use a porous extraction for example working as a single phase extractor as described above.

The coating does not have to be DUV resistant because it is not significantly exposed to exposure radiation, but the coating should be immersion liquid resistant, e.g. ultra-pure water resistant (a suitable coating can be, for example, Teflon and Lipocer).

Figure 22:
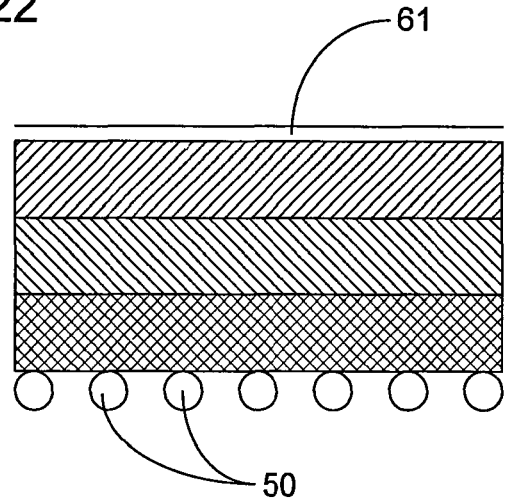
FIG. 22 illustrates, in plan, regions of a surface radially outwardly of an extractor which may be made to be lyophobic to immersion liquid.

FIG. 22 illustrates, in plan, a section of a fluid handling structure 12 of FIG. 6. As illustrated by cross-hatching, a part of the surface between the openings 50 and gas knife 61 can be made such that the immersion liquid has a receding contact angle with it of greater than 70°, desirably greater than 90°. Therefore, an advantage of an embodiment of the present invention can be gained when only a part of the surface between the openings 50 and the gas knife 61 is lyophobic to immersion liquid. However, more or less area of the surface may be covered with the coating as illustrated by the different areas with different diagonal cross-hatching. All or some of the areas of different hatchings may for example be made lyophobic to the immersion liquid in addition to or instead of the cross-hatched area.

The superlyophobic coating could be a lotus surface as described in U.S. patent application publication no. US 2005/0175776.

In an embodiment the lyophobic or superlyophobic surface includes the grooves described above, particularly the fine grooves.

In an embodiment the undersurface is superlyophobic away from the extraction openings 50. Close to the extraction openings 50 the undersurface is lyophilic. For example, bare stainless steel of the fluid handling structure 12 could be present. Immersion liquid (e.g. UPW) typically has a receding contact angle of 0, 10 or 20 or up to 30° with bare stainless steel.

In an embodiment the contact angle which the immersion liquid makes with the undersurface varies with distance from the extraction openings 50. This could be achieved, for example, by structuring (e.g. texturing) the undersurface before applying the lyophobic or superlyophobic coating. At the positions where the surface is more structured the coating will be more lyophobic. A coating which provides a surface with varying contact angle may be applied by many different application techniques, for example spray coating.

The contact angle which immersion liquid makes with a surface is at least partly due to the surface energy of the surface. A surface with a contact angle gradient may be referred to as a surface with a surface energy gradient. A surface energy may be sufficient to apply a force to a droplet of immersion liquid on the undersurface to transport it towards the extraction openings 50. In an embodiment, the surface energy gradient of the undersurface may vary between the extraction openings 50 and the gas knife opening 61. The surface energy gradient may transport droplets from the gas knife opening 61 towards the extraction openings 50, where the droplets can be removed. The feature may be applied in other locations of an immersion system (for example, where the distance over which the droplet is transported is small).

For the surface energy gradient to move a droplet, the force applied by the surface must overcome the hysteresis that the droplet exhibits when on the surface. The minimum force induced by the surface energy to achieve motion of the droplet is a function of the contact angle of the immersion liquid with respect to the surface.

Figure 24A:
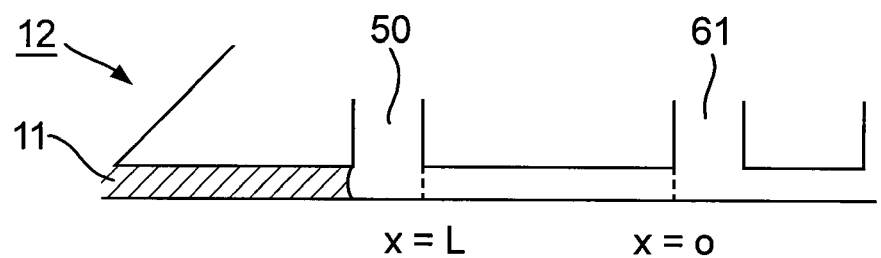
FIGS. 24 a and b refer to an arrangement of fluid handling structure with a surface contact angle which changes with surface location and the relationship between the contact angle and position.
Figure 24B:
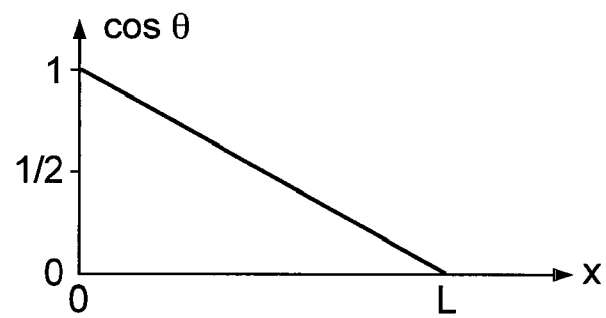

It is desirable for the droplet movement to have predictable behavior independent of the starting position of the droplet. In an embodiment the relationship between the minimum force for droplet movement and the distance traveled by the droplet is linear. To achieve the linear relationship, the cosine of the contact angle varies linearly with distance, and not the contact angle. In an embodiment the cosine is the maximum difference in contact angle on the surface. For the embodiment of an undersurface of a fluid handling structure 12 which is shown in FIG. 24*a*, FIG. 24*b* shows an example relationship between the cosine of the contact angle of the surface at a location on the surface and the distance of the location from the extraction openings 50 at L (i.e. distance x is equal to L) as a proportion of the full distance between the extraction openings 50 and the gas knife opening 61.

In an embodiment the change in contact angle can be achieved by using lyophobic particles to make the surface lyophobic and varying the amount of lyophobic particles applied with varying distance from the extraction openings 50 (for example the density of particles applied to a unit surface area, or the proportion of the surface covered by the particles). A smooth transition in contact angle going up towards the gas knife opening 61 is desired. This is because the meniscus of liquid extending between the undersurface and the substrate can move along the undersurface without pinning. However, because of the increase in contact angle away from the extraction openings, the resistance to movement of the meniscus increases as the meniscus moves away from the extraction openings 50. Therefore, the chances of liquid loss because of meniscus pinning (described below with reference to FIG. 23) can be reduced.

A lyophobic or superlyophobic coating often has a non-zero contact angle hysteresis and this is desirable. A non-zero contact angle hysteresis leads to a pinning hysteresis force which counteracts a capillary force acting on the meniscus. This results in better control of the position of the meniscus and thereby a shorter response time.

In an embodiment the lyophobic or superlyophobic area is provided by use of fine lyophobic grooves, as described above.

The principles described above can be applied to other areas of an immersion lithographic apparatus. For example, the top surface of a fluid handling structure may be made lyophobic or superlyophobic and treated in the same way as the undersurface between the extraction openings 50 and gas knife 61 as described above. Additionally, an undersurface of the projection system through which the projection beam PB does not propagate could be treated in the same way.

Figure 23:
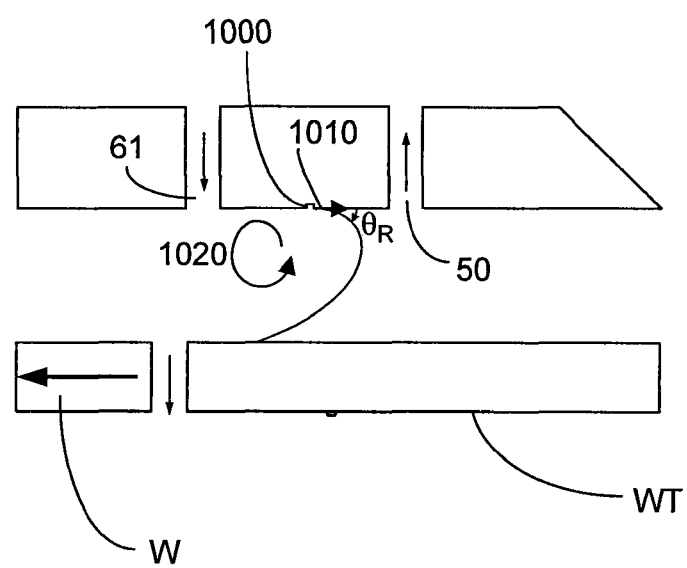
FIG. 23 illustrates, in cross-section, how one embodiment of the present invention can reduce the chance of liquid loss.

In an embodiment a concentric groove 1000 between the extraction openings 50 and the gas knife 61 is provided in the undersurface of the fluid handling structure 12. This is illustrated in FIG. 23 which is a cross section through a fluid handling structure 12. The groove 1000 may be about 50 μm wide and 20 μm deep, with sharp edges (with a radius of less than 1 μm, for example). No surface treatment is applied on the radially inner side of the groove 1000, for example leaving a lyophilic surface such as bare stainless steel. However, a lyophobic or superlyophobic surface may be present radially outwardly of the groove 1000 and radially inwardly of the gas knife 61. In one embodiment the lyophobic or superlyophobic surface is in the form of a sticker. In one embodiment the lyophobic or superlyophobic surface is a coating as described elsewhere in this document.

The inner concentric edge of the groove 1000 acts as a pinning feature. It avoids complete wetting of the gas damper (only the inner part is wetted). If the groove 1000 is located away from a recirculation vortex of gas 1020, the portion of the undersurface radially inward of the groove 1000 completely de-wets during the return scan provided the meniscus de-pins from the groove 1000 edge. The de-wetting is indicated by the arrow 1010 in FIG. 23. De-pinning of the meniscus from the groove 1000 edge is expected. The surface radially inwardly of the groove 1000 de-wets after the meniscus has become de-pinned from the BES and the position of the meniscus on the undersurface moves radially inwardly towards the extraction openings 50.

The groove 1000 pins the meniscus at the groove 1000 so as to avoid complete wetting of the area between extraction openings 50 and gas knife 61. By doing so, the risk of liquid loss during the de-wetting of that particular area that would otherwise occur is reduced. The groove 1000 is several tens of micrometers wide and deep.

Although reference has been made to the use of one or more openings 50, 71 which operate as two phase extractors, in an embodiment based on any of the variations described herein, the one or more openings in any embodiment may be replaced by a porous member or microsieve, like that described in U.S. patent application publication no. US 2006-0038968, which is hereby incorporated by reference in its entirety. Each porous member may operate to extract liquid in single phase, or dual phase, fluid flow. In an embodiment, the gas flow may be directed radially inwardly but instead of if being extracted through the porous member, the gas flow may be extracted by a gas extraction opening located between the gas supply aperture and the porous member. In such an embodiment the gas flow helps to reduce the residue liquid left on the facing surface by the gas knife device. An embodiment of the invention may therefore be implemented in such an arrangement, achieving similar benefits as achieved by the embodiments described with reference to at least FIGS. 8 and 9.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid. In an embodiment, the immersion liquid may be water.

The descriptions above are intended to be illustrative, not limiting. Thus, it will be apparent to one skilled in the art that modifications may be made to the invention as described without departing from the scope of the claims based on this disclosure.

In summary, the present disclosure provides various embodiments, which may include one or more of the following clauses:

1. A fluid handling structure for a lithographic apparatus, the fluid handling structure successively having, at a boundary from a space configured to comprise immersion fluid to a region external to the fluid handling structure:

an extractor comprising at least one opening arranged in a first line that, in use, is directed towards a substrate and/or table; and a liquid manipulator on a surface that, in use, faces the substrate and/or table to reduce the chance of droplets on the surface from coalescing.

2. The fluid handling structure of clause 1, wherein the liquid manipulator aids in the removal of droplets from the surface towards the extractor.

3. The fluid handling structure of clause 1 or 2, wherein the liquid manipulator is a structure.

4. The fluid handling structure of any of the clauses 1-3, wherein the liquid manipulator comprises a series of grooves in the surface.

5. A fluid handling structure for a lithographic apparatus, the fluid handling structure successively having, at a boundary from a space configured to comprise immersion fluid to a region external to the fluid handling structure:

an extractor comprising at least one opening that, in use, is directed towards a substrate and/or table; and a plurality of grooves in a surface of the fluid handling structure that, in use, faces the substrate and/or the table.

6. The fluid handling structure of clause 5, wherein the extractor is formed in the surface.

7. The fluid handling structure of clause 6, wherein the extractor comprises a porous member.

8. The fluid handling structure of clause 7, wherein the grooves are formed by corrugations in the porous member.

9. The fluid handling structure of any of clauses 4-8, wherein the grooves are elongate and aligned in a direction which passes through the space.

10. The fluid handling structure of clause 9, wherein the direction passes through the center of the space.

11. The fluid handling structure of any of clauses 4-10, wherein the grooves, in cross-section in an elongate direction, have a shape chosen from the group comprising: straight, saw toothed, corrugated, sine shaped, repeating trapeziums, or an asymmetric shape.

12. The fluid handling structure of any of clauses 4-11, wherein the extractor comprises a plurality of extraction openings in a line surrounding the space.

13. The fluid handling structure of clause 12, wherein each extraction opening has at least one groove associated with it and each associated groove is elongate in a direction which passes through its associated extraction opening.

14. The fluid handling structure of clause 13, wherein each groove has a depth and/or width of between 0.1 and 2 µm.

15. The fluid handling structure of any of clauses 12-14, wherein the line is, in plan, a cornered shape.

16. The fluid handling structure of clause 15, wherein the or each extraction opening at a corner of the cornered shape has more grooves associated with it than an extraction opening not at a corner of the cornered shape.

17. The fluid handling structure of any of clauses 12-16, wherein at least one of the grooves is elongate in a direction with a component parallel to the line between two of the plurality of extraction openings.

18. The fluid handling structure of clause 17, wherein the at least one of the grooves has a depth and/or width of between 30 and 90 µm.

19. The fluid handling structure of any of clauses 4 to 18, wherein the plurality of grooves are radially outwardly of the extractor.

20. The fluid handling structure of any of clauses 1-11, wherein the extractor comprises a porous member connected to an under pressure source.

21. The fluid handling structure of any of clauses 1-11, wherein the extractor comprises an elongate opening or a plurality of openings arranged in a first line that, in use, is/are directed towards a substrate and/or substrate table configured to support the substrate.

22. The fluid handling structure of any of clauses 4-21, wherein the grooves have a pitch of between 80 and 160 µm between the grooves.

23. The fluid handling structure of any of clauses 4-22, wherein the immersion fluid makes a receding contact angle with the grooves of greater than 70°.

24. The fluid handling structure of any of clauses 4-22, wherein the immersion fluid makes a receding contact angle with the grooves of less than 70°.

25. The fluid handling structure of any preceding clause, wherein the immersion liquid has a lyophobic contact angle with at least part of the undersurface of the fluid handling structure.

26. The fluid handling structure of clause 25, wherein the at least part of the undersurface of the fluid handling structure is coated.

27. The fluid handling structure of clause 25 or 26, wherein the at least part of the undersurface of the fluid handling structure comprises a surface between a line of extraction openings and a gas knife opening.

28. The fluid handling structure of any of clauses 25 to 27, wherein the at least part of the undersurface of the fluid handling structure provides a surface energy gradient.

29. The fluid handling structure of any of clauses 1-28, wherein the extractor forms a first line and further comprising a first gas knife device arranged in a second line having an elongate aperture surrounding the space and being positioned radially outwardly of the liquid manipulator or grooves.

30. The fluid handling structure of clause 29, further comprising:
an elongate opening or a plurality of openings in a third line radially outwardly of the first gas knife device; and
a second gas knife device having an elongate aperture in a fourth line and positioned radially outwardly of the third line.

31. A fluid handling structure for a lithographic apparatus, the fluid handling structure comprising:
an elongate extractor comprising at least one opening that, in use, faces a facing surface, the facing surface comprising a substrate and/or a table; and
a plurality of grooves in a surface of the fluid handling structure that, in use, faces the facing surface, wherein the grooves are substantially co-aligned and are angled relative to the extractor.

32. A fluid handling structure for a lithographic apparatus, the fluid handling structure comprising:
at least one gas knife opening configured to form in use a gas knife directed towards a facing surface comprising a substrate and/or a table; and
a plurality of grooves in a surface of the fluid handling structure that, in use, faces the substrate and/or the substrate table, wherein the grooves are substantially co-aligned and are angled relative to the gas knife opening.

33. A fluid handling structure for a lithographic apparatus, the fluid handling structure comprising:
an extractor comprising a porous member that, in use, faces a facing surface, the facing surface comprising a substrate and/or a table,
wherein a surface of the porous member facing the facing surface has at least one recess and/or protrusion.

34. The fluid handling structure of clause 33, wherein the at least one recess and/or protrusion is part of at least one groove.

35. The fluid handling structure of clause 34, wherein the surface of the porous member has a plurality of the grooves.

36. The fluid handling structure of clause 35, wherein the plurality of grooves are substantially parallel.

37. The fluid handling structure of clause 36, wherein the plurality of substantially parallel grooves form corrugations.

38. The fluid handling structure of any of clauses 33 to 37, wherein at least a part of the surface of the porous member is substantially flat.

39. A lithographic apparatus comprising the fluid handling structure of any preceding clause.

40. The lithographic apparatus of clause 39, comprising a substrate table to support a substrate and a projection system to project a projection beam on a target portion of the substrate, wherein the fluid handling structure is configured to supply and confine immersion liquid to a space between the projection system and the substrate, the substrate table, or both.

41. A device manufacturing method, comprising:
using the fluid handling structure of any of clauses 1 to 38;
supplying liquid to a space between the fluid handling structure, a projection system and a substrate, a substrate table to support the substrate, or both; and projecting a patterned beam onto a target portion of the substrate.

The invention claimed is:

1. A fluid handling structure for a lithographic apparatus, the fluid handling structure having, at a boundary thereof, from a space configured to comprise immersion fluid toward a region external to the fluid handling structure:
   an extractor comprising at least one opening arranged in a first line that, in use, is directed towards a substrate and/or a table; and
   a liquid manipulator on a surface that, in use, faces the substrate and/or the table to reduce the chance of droplets on the surface from coalescing, the liquid manipulator being at least partially outward, relative to the space, of the at least one opening.

2. The fluid handling structure of claim 1, wherein the liquid manipulator aids in the removal of droplets from the surface towards the extractor.

3. The fluid handling structure of claim 1, wherein the liquid manipulator is a structure.

4. The fluid handling structure of claim 1, wherein the liquid manipulator comprises a series of grooves in the surface.

5. The fluid handling structure of claim 4, wherein the grooves are elongate and aligned in a direction which passes through the space.

6. The fluid handling structure of claim 1, wherein the extractor comprises a porous member connected to an under pressure source.

7. The fluid handling structure of claim 1, wherein the extractor comprises an elongate opening or a plurality of openings arranged in a first line that, in use, is/are directed towards the substrate and/or the table.

8. The fluid handling structure of claim 1, wherein the extractor forms a first line and further comprising a first gas knife device arranged in a second line having an elongate aperture surrounding the space and being positioned radially outwardly of the liquid manipulator.

9. The fluid handling structure of claim 8, further comprising:
   an elongate opening or a plurality of openings in a third line radially outwardly of the first gas knife device; and
   a second gas knife device having an elongate aperture in a fourth line and positioned radially outwardly of the third line.

10. A fluid handling structure for a lithographic apparatus, the fluid handling structure having, at a boundary thereof, from a space configured to comprise immersion fluid toward a region external to the fluid handling structure:
    an extractor comprising at least one opening that, in use, is directed towards a substrate and/or table; and
    a plurality of grooves in a surface of the fluid handling structure that, in use, faces the substrate and/or the a table, the plurality of grooves being at least partially outward, relative to the space, of the at least one opening.

11. The fluid handling structure of claim 10, wherein the extractor is formed in the surface.

12. The fluid handling structure of claim 11, wherein the extractor comprises a porous member.

13. The fluid handling structure of claim 10, wherein the grooves are elongate and aligned in a direction which passes through the space.

14. The fluid handling structure of claim 10, wherein the grooves, in cross-section in an elongate direction, have a shape chosen from the group comprising:
    straight, saw toothed, corrugated, sine shaped, repeating trapeziums, or an asymmetric shape.

15. The fluid handling structure of claim 10, wherein the extractor comprises a plurality of extraction openings in a line surrounding the space.

16. The fluid handling structure of claim 10, wherein the immersion fluid makes a receding contact angle with the grooves of greater than 70°.

17. A fluid handling structure for a lithographic apparatus, the fluid handling structure comprising:
    an elongate extractor comprising at least one opening that, in use, faces a facing surface, the facing surface comprising a substrate and/or a table; and
    a plurality of grooves in a surface of the fluid handling structure that, in use, faces the facing surface, wherein the grooves are substantially co-aligned and are angled relative to the extractor, the plurality of grooves being at least partially outward, relative to a center of the fluid handling structure, of the at least one opening.

18. The fluid handling structure of claim 17, wherein the grooves are elongate and aligned in a direction which passes through the space.

19. A fluid handling structure for a lithographic apparatus, the fluid handling structure comprising:
    an extractor comprising at least one extraction opening that, in use, is directed towards a substrate and/or table;
    at least one gas knife opening configured to form in use a gas knife directed towards a facing surface comprising a substrate and/or a table; and
    a plurality of grooves in a surface of the fluid handling structure that, in use, faces the substrate and/or the table, wherein the grooves are substantially co-aligned and are angled relative to the at least one gas knife opening, and the plurality of grooves are at least partially outward of the at least one extraction opening and at least partially inward of the at least one gas knife opening.

20. A device manufacturing method, comprising:
    using a fluid handling structure for a lithographic apparatus, the fluid handling structure for a lithographic apparatus, the fluid handling structure having, at a boundary thereof, from a space configured to comprise immersion fluid toward a region external to the fluid handling structure: an extractor comprising at least one opening arranged in a first line that, in use, is directed towards a substrate and/or a table, and a liquid manipulator on a surface that, in use, faces the substrate and/or the table to reduce the chance of droplets on the surface from coalescing, the liquid manipulator being at least partially outward of the at least one opening relative to the space;
    supplying liquid to the space between the fluid handling structure, a projection system and the substrate, the table, or both; and
    projecting a patterned beam onto a target portion of the substrate.

* * * * *